(12) United States Patent
Zang et al.

(10) Patent No.: US 11,778,794 B2
(45) Date of Patent: Oct. 3, 2023

(54) BIOPOLYMER-BASED ELECTROMAGNETIC INTERFERENCE SHIELDING MATERTALS

(71) Applicant: Software Defined Technologies, Inc., Carlsbad, CA (US)

(72) Inventors: De Yu Zang, Irvine, CA (US); Michael M. Salour, Carlsbad, CA (US); James G. Grote, Yellow Springs, OH (US)

(73) Assignee: Software Defined Technologies, Inc, Carlsbad, CA (US)

( * ) Notice: Subject to any disclaimer, the term of this patent is extended or adjusted under 35 U.S.C. 154(b) by 57 days.

(21) Appl. No.: 17/334,113

(22) Filed: May 28, 2021

(65) Prior Publication Data

US 2021/0400855 A1 Dec. 23, 2021

Related U.S. Application Data

(60) Continuation-in-part of application No. 16/284,507, filed on Feb. 25, 2019, now Pat. No. 11,026,358, which is a continuation of application No. 15/196,114, filed on Jun. 29, 2016, now Pat. No. 10,219,418, which is a division of application No. 13/746,993, filed on Jan. 22, 2013, now Pat. No. 9,408,336.

(60) Provisional application No. 61/588,981, filed on Jan. 20, 2012.

(51) Int. Cl.
*H05K 9/00* (2006.01)
*H05K 1/02* (2006.01)
*C09D 5/32* (2006.01)
*C09D 199/00* (2006.01)
*H05K 3/12* (2006.01)

(52) U.S. Cl.
CPC ............ *H05K 9/0083* (2013.01); *C09D 5/32* (2013.01); *C09D 199/00* (2013.01); *H05K 1/0216* (2013.01); *H05K 3/1283* (2013.01); *H05K 9/009* (2013.01); *H05K 1/0209* (2013.01); *H05K 9/0022* (2013.01); *H05K 2201/0257* (2013.01)

(58) Field of Classification Search
CPC .................................................. H05K 9/0083
See application file for complete search history.

(56) References Cited

U.S. PATENT DOCUMENTS 9,408,336 B1 8/2016 Zang
1,021,941 A1 2/2019 Zang
(Continued)

OTHER PUBLICATIONS

R. Subbiah et al., Nanoparticles: Functionalization and Multifunctional Applications in Biomedical Sciences, Current Medicinal Chemistry, 2010, 17, 4559-4577.
(Continued)

*Primary Examiner* — Hung V Ngo
(74) *Attorney, Agent, or Firm* — Culhane Meadows PLLC; Orlando Lopez

(57) ABSTRACT

An electromagnetic interference (EMI) shielded device which includes an object to be shielded and an EMI shielding material encompassing the object. The EMI shielding material is made up of, but not limited to a broadband biopolymer or polymer dissolved in organic solvents and shielding guest material. The specific makeup of the shielding material and fabrication procedure of the shielding material is also included herein.

30 Claims, 16 Drawing Sheets

(56) References Cited

U.S. PATENT DOCUMENTS

| | | | | | |
|---|---|---|---|---|---|
| 2001/0038086 | A1* | 11/2001 | Yoshida | ............... | H05K 9/0083 252/62.53 |
| 2010/0246771 | A1* | 9/2010 | Hawver | ................. | G03B 42/02 378/98.2 |
| 2011/0281034 | A1* | 11/2011 | Lee | ........................ | B82Y 30/00 427/294 |
| 2012/0009267 | A1* | 1/2012 | Cho | .................... | A61K 31/713 514/777 |

OTHER PUBLICATIONS

Jose M. Larios et al., Oxidative Protein Cross-linking Reactions Involving L-Tyrosine in Transforming Growth Factor-f1-stimulated Fibroblasts, The Journal of Biological Chemistry, vol. 276, No. 20, Issue of May 18, pp. 17437-17441, 2001.

De Yu Zang and James G. Grote, DNA-Based Nanoparticle Composite Materials for EMI Shielding, Feb. 2012Proceedings of SPIE—The International Society for Optical Engineering 8259:7.

Magali Frugier and Paul Schimmel, Subtle atomic group discrimination in the RNA minor groove, Proc. Natl. Acad. Sci. USA, vol. 94, pp. 11291-11294, Oct. 1997.

J. M. Jamison et al., RNA-intercalating agent interactions: in vitro antiviral activity studies, Antiviral Chemistry & Chemotherapy (1990) 1(6), 333-347.

S. A. Islam and S. Neidle, Nucleic Acid Binding Drugs. X. * A Theoretical Study of Proflavine Intercalation into RNA and DNA Fragments: Comparison with Crystallographic Results, Acta Cryst. (1984). B40, 424-429.

Adair D Richards and Alison Rodger, Synthetic Metallomolecules as Agents for the Control of DNA Structure, Apr. 2007 Chemical Society Reviews 36(3):471-83.

Damian Deavail et al., Drug-Induced Oxidative Stress and Toxicity, Journal of Toxicology 2012(3):645460.

* cited by examiner

BIOPOLYMER-BASED ELECTROMAGNETIC INTERFERENCE SHIELDING MATERIALS

CROSS REFERENCE TO RELATED APPLICATIONS

This application is a continuation in part of U.S. patent application Ser. No. 16/284,507, filed on Feb. 25, 2019, entitled BIOPOLYMER-BASED ELECTROMAGNETIC INTERFERENCE SHIELDING MATERIALS, which is a continuation of co-pending U.S. patent application Ser. No. 15/196,114, filed on Jun. 29, 2016, entitled BIOPOLYMER-BASED ELECTROMAGNETIC INTERFERENCE SHIELDING MATERIALS, which is a divisional of U.S. patent application Ser. No. 13/746,993, filed Jan. 22, 2013, entitled BIOPOLYMER-BASED ELECTROMAGNETIC INTERFERENCE SHIELDING MATERIALS, which in turn claims priority to and benefit of U.S. Provisional Application No. 61/588,981, filed Jan. 20, 2012, the entire contents of which are incorporated by reference herein for all purposes.

STATEMENT REGARDING FEDERALLY SPONSORED RESEARCH OR DEVELOPMENT

This invention was made with government support under Contract No. FA-8650-10-0-C-5406 awarded by the U.S. Air Force. The government has certain rights in the invention.

BACKGROUND OF THE INVENTION

As the speeds at which electronics operates continue to increase, the stray high frequency radio frequency (RF) or electromagnetic interference (EMI) radiation that is emitted continues to increase as well. This high frequency RF/EMI radiation interferes with all the electronic devices, chips and circuit boards in close proximity to each other and can cause the chips and circuits to malfunction. Thus, the electronic devices, chips and circuit boards need to be shielded from one another to prevent this stray radiation from causing malfunctions. This RF/EMI radiation can come from devices, chips, intra- and inter circuit boards and between boards. The higher the frequencies the more difficult and expensive it becomes to shield the circuits. The prior and current RF/EMI shielding technologies use traditional techniques based on conductive materials or coatings, such as gold (Au), copper (Cu), silver (Ag) or aluminum (Al), surrounding the device, chip and/or circuit board. This is a complicated, expensive and time-consuming process.

Prior procedures are difficult, complicated, labor intensive, expensive and time-consuming, especially the electrical grounding processing.

In addition, the insulating materials or molds, which are deposited on top of the device, chip or circuit to prevent electrical shorting, typically have low thermal conductivity. This holds the heat, generated by the device, chip or circuit, in the device, chip or circuit. Retention of heat in the device, chip or circuit can cause overheating, reduce performance and reduce lifetime.

Another typical example is a conductive metal grid or mesh enclosure surrounding the device, chip or circuit to block external static and non-static electric fields. This is known as a Faraday cage. A Faraday cage shields the interior from external electromagnetic radiation if the conductor is thick enough and the holes of the grid or mesh are significantly smaller than the wavelength of the radiation. This type of shielding is also rigid and non conformable. In addition, neither type of shielding technique shields between devices or wires within a chip or between chips or wires within or on a board. They only shield from internal radiation getting out or from external radiation getting in.

BRIEF SUMMARY OF THE INVENTION

The embodiments of this disclosure facilitate the fabrication and applications of biopolymer-based, broadband electromagnetic interference shielding materials (BESM) that can be employed to numerous areas including, but not limited to, electronics, telecommunications, and aviation, etc.

Broadband biopolymer-based electromagnetic interference shielding materials (BESM) are made up of, but not limited to, deoxyribonucleic acid (DNA), crosslinked DNA, DNA-surfactant based complex, ribonucleic acid (RNA), crosslinked RNA, RNA-surfactant based complex or silk, or any other biopolymer, which could be dissolved in organic or ionic solvents, and shielding guest materials comprising at least one of particles, powders, tubes or rods, flakes, fiber or sheets. The surfactant includes at least one of hexadecyltrimethylammonium chloride (CTMA), also referred to as cetyltrimethylammonium chloride, hexadecyltrimethylammonium bromide (CTAB), also referred to as cetyltrimethylammonium bromide, cetylpyridinium chloride (CP) or benzyldimethyloctylammonium chloride (BDMA). The surfactant can include a surfactant from heptadecanoic or margaric acid family of fatty acids, or their derivatives The organic solvents could be, but not limited, butanol, ethanol, methanol, or a chloroform/alcohol blend. The metal and the shielding guest materials can include at least one of metals, graphite, graphene, semiconductors or conductive polymers and could include, but not limited to, noble metals (such as silver, gold, aluminum, copper), carbon-based graphite, carbon black, graphene, nanotubes, flakes, fibers or other conductive materials. In some instances, the shielding guest material is functionalized by surface modification, surface modification including conjugation of chemicals or biomolecules onto a surface of the shielding guest material.

The BESM can be nonconductive, if the metal filler doping ratio is lower than the percolation threshold. The surface resistance of nonconductive BESM films could be >30 MD/sq. and the BESM can form BESM films on certain substrates and is spreadable, conformable and curable at low or room temperature with good adhesion with most materials including, but not limited, metal, glass, wood, plastics, semiconductors and other biopolymers.

The biopolymer-based material is not restricted to DNA-based and could be any organic polymers including, but not limited, Poly (methyl methacrylate) (PMMA) or Polyvinyl alcohol (PVA), polycarbonate, etc.

The BESM films have very have high EMI shielding efficiency over frequency ranges from substantially DC (0 Hz) to 100 GHz. The shielding efficiency, for example, could be as high as 60 dB for a thin BESM film with a thickness of ~50 µm. For example, but not limited thereto, the BESM films provide efficiency of up to approximately 60 dB for shielding material with a thickness of approximately 50 mm over a frequency range in the DC and Hz and MHz ranges and can effectively block EMI radiation up to 85 dB, to date, over a frequency range of 8-12 GHz, to date, for 100 µm thick film thickness.

Further, a thin BESM layer (typically ~30-50 µm) could block EMI radiation up to, for example, 60 dB effectively over an RF frequency range from low kilohertz (KHz) to tens of gigahertz (GHz), exhibiting excellent EMI shielding efficiency.

In addition, the method of making the EMI shielding material includes, but is not limited to the following steps: dissolving DNA or RNA in a first amount of de-ionized water for a first period of time to form a DNA or RNA solution, dissolving a surfactant in a second amount de-ionized water for a second period of time to form a surfactant solution, making a DNA or RNA-surfactant complex by adding the DNA or RNA solution to the surfactant solution, thereby causing a DNA or RNA-surfactant precipitate to form, making an organic solvent based DNA or RNA surfactant solution by dissolving the DNA or RNA-surfactant precipitate in an organic solvent, and making the EMI shielding material by mixing shielding guest materials; the shielding guest materials comprising at least one of particles, powders, tubes or rods, flakes, fiber or sheets, with the organic solvent based DNA or RNA-surfactant solution.

In another instance, the method of making the EMI shielding material includes, but is not limited to the following steps: exposing DNA or RNA to strong ultraviolet (UV) light in order to cross-link the DNA or RNA, thereby obtaining cross-linked DNA or RNA, making an organic solvent based cross-linked DNA or RNA solution by dissolving the cross-linked DNA or RNA in an organic solvent, and making the EMI shielding material by mixing shielding guest materials; the shielding guest materials comprising at least one of particles, powders, tubes or rods, flakes, fiber or sheets, with the cross-linked DNA or RNA solution.

In yet another instance, the method of making the EMI shielding material includes, but is not limited to the following steps: dissolving DNA or RNA in a first amount of an aqueous solvent for a first period of time to form a DNA or RNA solution, mixing shielding guest material into the DNA or RNA solution, the shielding guest material functionalized by surface modification; surface modification comprising attachment of chemicals or biomolecules onto a surface of the shielding guest material; the chemicals or biomolecules; the chemicals or biomolecules configured to interact with the DNA or RNA, dissolving a surfactant in a second amount de-ionized water for a second period of time to form a surfactant solution, making a DNA or RNA-surfactant complex by adding the DNA or RNA-solution with the shielding guest material to the surfactant solution, thereby causing a DNA or RNA-shielding guest material-surfactant precipitate to form, and making an organic solvent based DNA or RNA-shielding guest material surfactant solution by dissolving the DNA or RNA-shielding guest material-surfactant precipitate in an organic solvent.

The method for making an EMI shielding material film includes producing the EMI shielding material film by forming the EMI shielding material of these teachings into a film by one of at least one of casting, spin depositing, spray coating, ink jet printing, vapor deposition, molecular vapor deposition or embossing.

BESM also has the following advantages:

a. High EMI shielding efficiency.

b. In some embodiments, Nonconductivity, making a single EMI shielding layer on top of, and in direct contact with, electronic circuit boards possible.

c. Spreadable (with liquid phase BESM), conformable and compatible with the shapes and most object materials, such as metals, glass and plastic, etc.

d. Large thermal conductivity that could dissipate heat generated by high-speed electronics e. Low cost for materials and processes, etc.

For a better understanding of the present invention, reference is made to the accompanying drawings, detailed description and claims.

DETAILED DESCRIPTION OF THE INVENTION

Figure 1A:
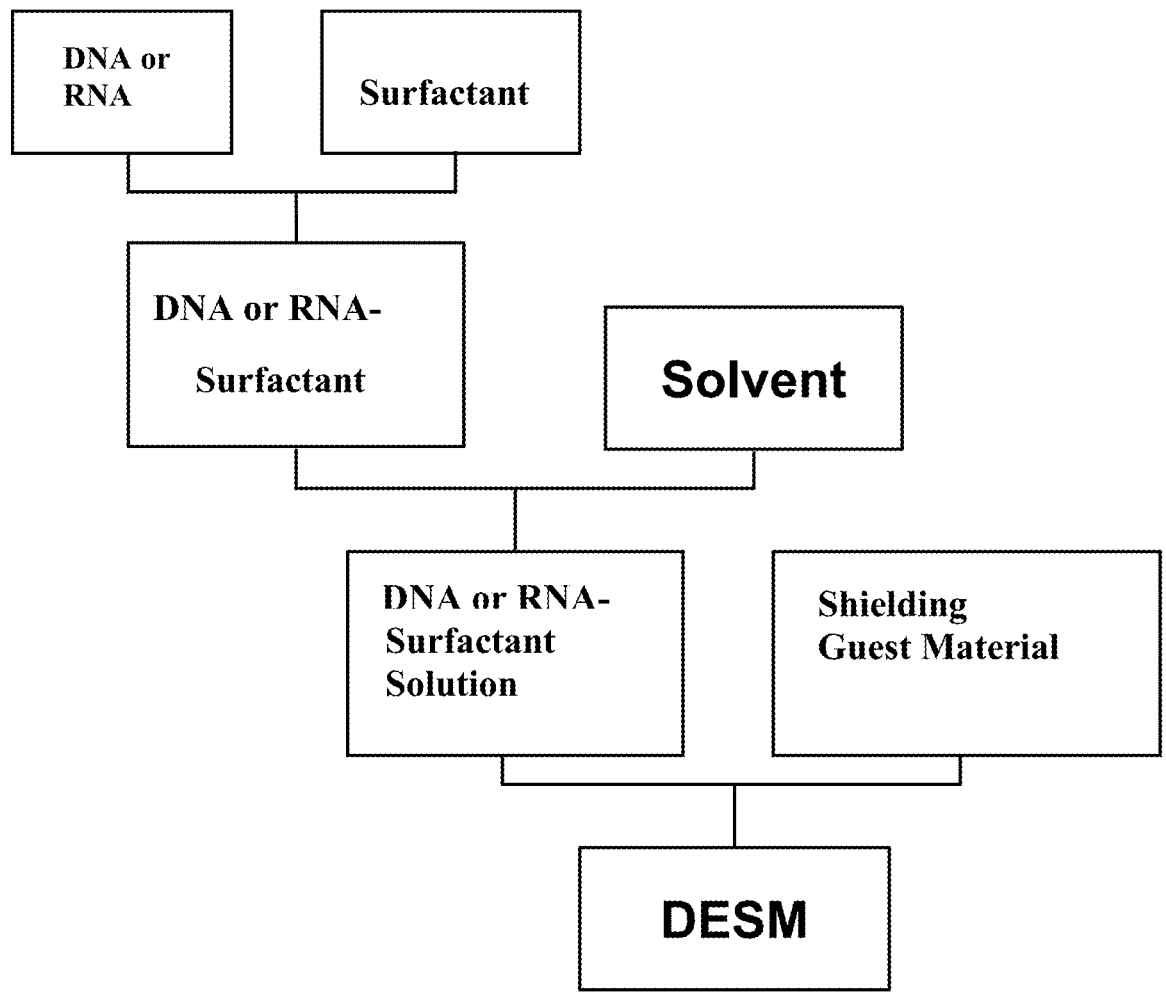
FIG. 1A is a schematic block diagram illustration of one embodiment of a fabrication procedure of the BESM (DNA or RNA-based in this embodiment)

The embodiments of this disclosure facilitate the fabrication and applications of biopolymer-based, broadband electromagnetic interference shielding materials (BESM) that can be employed to numerous areas including, but not limited to, electronics, telecommunications, and aviation, etc.

"Shielding guest material," as used herein, refers to material, comprising at least one of particles, powders, tubes or rods, flakes, fiber or sheets, that is added to a solution of a biopolymer or polymer in order to increase EMI shielding effectiveness.

Broadband (from DC (0 Hz) to approximately 100 GHz or higher) biopolymer-based electromagnetic interference shielding materials (BESM) are made up of a biopolymer or polymer, such as, but not limited to, deoxyribonucleic acid (DNA), crosslinked DNA, DNA-surfactant based complex, ribonucleic acid (RNA), crosslinked RNA, RNA-surfactant based complex, silk, or any other biopolymer, which could be dissolved in organic or ionic solvents, and shielding guest materials; the shielding guest materials comprising at least one of particles, powders, tubes or rods, flakes, fiber or sheets. The surfactant could be, but not limited to, a surfactant from heptadecanoic or margaric acid family of fatty acids, or their derivative. The surfactant could be, but not limited to, at least one of hexadecyltrimethylammonium chloride (CTMA), also referred to as cetyltrimethylammonium chloride, hexadecyltrimethylammonium bromide (CTAB), also referred to as cetyltrimethylammonium bromide, cetylpyridinium chloride (CP) or benzyldimethyloctylammonium chloride (BDMA) These surfactants have longer alkyl chains, produce a water-insoluble DNA-surfactant complex and induce higher mechanical and thermal stability properties. DNA complexes made with longer alkyl chains might damage the double helix structure of DNA as the strong association and aggregation among alkyl chains could potentially break the hydrogen bonds of the nucleobase pairs.

The organic solvents could be, but not limited, butanol, ethanol, methanol, or a chloroform/alcohol blend. The shielding guest materials could include, but not limited to, nano-particles, micro-particles, nano-powders, micro-powders, nano-flakes, micro-flakes, nano-strands, micro-strands, nano-rods, micro-rods, nano-sheets or micro-sheets. The shielding guest materials could include, but not limited to, at least one of metals, graphite, graphene, semiconductors, conductive polymers or other conductive materials.

The BESM can be nonconductive, if the filler (shielding guest material) doping ratio is lower than the percolation threshold. In a mixture between a dielectric and a metallic component, the conductivity and the dielectric constant of this mixture show a critical behavior if the fraction of the metallic component reaches the percolation threshold. The behavior of the conductivity near this percolation threshold will show a smooth changeover from the conductivity of the dielectric component to the conductivity of the metallic component. So, below percolation threshold the BSEM is non-conductive and above the percolation threshold the BSEM is conductive. The surface resistance of nonconductive BESM films could be >30 MD/sq. and the BESM can form BESM films on certain substrates and is spreadable, conformable and curable at low or room temperature with good adhesion with most materials including, but not limited, metal, glass, wood, plastics, semiconductors and other biopolymers.

The biopolymer-based material is not restricted to deoxyribonucleic acid (DNA), crosslinked DNA, DNA-surfactant based complex, ribonucleic acid (RNA), crosslinked RNA, RNA-surfactant based complex or silk and could be any organic polymers including, but not limited, Poly (methyl methacrylate) (PMMA) or Polyvinyl alcohol (PVA), polycarbonate, etc.

The BESM films have very have high EMI shielding efficiency over frequency ranges from substantially DC to 100 GHz. The shielding efficiency, for example, could be as high as 60 dB for a thin BESM film with a thickness of ~50 µm. For example, but not limited thereto, the BESM films provide efficiency of up to approximately 85 dB for shielding material with a thickness of approximately 50 mm over a frequency range in the DC and Hz and MHz ranges and approximately 85 dB in the GHz range.

Further, a thin BESM layer (typically ~30-50 µm) could block EMI radiation up to, for example, 60 dB or more effectively over an RF frequency range from low kilohertz (KHz) to tens of gigahertz (GHz), exhibiting excellent EMI shielding efficiency.

BESM also has the following advantages:

a. High EMI shielding efficiency.

b. Nonconductivity, making a single EMI shielding layer on top of, and in direct contact with, electronic circuit boards possible.

c. Spreadable (with liquid phase BESM), conformable and compatible with the shapes and most object materials, such as metals, glass and plastic, etc.

d. Large thermal conductivity that could dissipate heat generated by high-speed electronics.

e. Low cost for materials and processes, etc.

The present embodiments utilize, non-conductive in some instances, shielding guest material (BESM), such as, but not limited to, metal or carbon nanoparticle or nanopowder composite, to form biopolymer-based, EMI shielding material (BESM), and may involve the following process: cast the BESM on the boards to form a single layer coating. The coating could be cured at low or room temperature, for example, approximately 60-80 degrees F. for a few hours, for example, approximately 1-4 hours. There is no need for grounding, if the coating is nonconductive Another important advantage of using nonconductive BESM for EMI-shielding on high-speed electronic devices and PCBs is that the BESM coating could quickly dissipate the heat generated by the high-speed electronics, due to its larger thermal conductivity compared to other polymers and epoxies. For example, thermal conductivity was measured of 0.82 watts/meter, degrees Kelvin (W/(m, K)) for DNA only (no nanoparticles of nanopowders) and 0.62 W/(m, K) for DNA-CTMA only (no nanoparticles of nanopowders). The thermal conductivity of PMMA is 0.12 W/((m, K). Therefore, the thermal conductivity of the DNA or RNA-based materials is a minimum of five to seven times higher than that of other polymers and epoxies.

It is also possible with the present embodiments to harden electrical, electronic devices, systems, transformers and transmission lines.

Further, for sensors applications, the BESM can fit in the sensors applications under an environment where radio frequency (RF) is present. An excellent example of such applications is the hyperthermia using microwave treatment for cancer. It was found that cancer cells are very sensitive to temperature. By heating the cancer cells, it may kill the tumors. It has been shown that the cancerous tissues can be destroyed at exposures of ~108° F. for one hour. Hyperthermia treatment of cancer is based on this. In the hyperthermia microwave treatment, the temperature around the cancer areas can be raised using RF radiation, similar to that of microwave ovens used in our kitchens to heat food. Precisely controlling temperature is the key. To monitor the temperature precisely, expensive dielectric and optical fiber-based temperature sensors are most commonly used since inexpensive, metal-based temperature sensors will disturb the RF waveforms and also, loose measurement accuracy.

Coating BESM on to the metal-based temperature sensors can avoid such problems and reduce the cost of the treatment.

The broadband, biopolymer-based EMI shielding materials (BESM) can be produced by mixing, for example, DNA-surfactant complex (in one embodiment, DNA-CTMA) and metal-based nanoparticles or nanopowders as fillers, CTMA is an abbreviation of cetyltrimethylammonium chloride or hexadecyltrimentylamonium chloride.

In one embodiment, process procedures are described with respect to FIG. 1A. The detailed process for a DNA or RNA-surfactant-based BESM material is described as follows;

Make Water-Based DNA or RNA Solution

Dissolve DNA or RNA in de-ionized water at room temperature, for example, approximately 60-80 degrees F. at a ratio of approximately 4 grams/liter using a magnetic stirrer. Mix until fully dissolved which may take approximately two hours;

Dissolve a surfactant (for example, CTMA) in deionized water at approximately room temperature, for example, approximately 60-80 degrees F. at a ratio of approximately 4 grams/liter using a magnetic stirrer. Mix until fully dissolved which may be approximately five minutes;

Make DNA or RNA-surfactant complex, such as, for example, DNA-CTMA. The DNA or RNA solution is added dropwise to the surfactant (CTMA) solution with a burette at a rate of about 1 drop per minute. A white DNA or RNA-surfactant (CTMA) precipitate forms as the DNA or RNA is added to the surfactant (CTMA). The solution is mixed for an additional 4 hours at room temperature. Filter DNA or RNA-surfactant (CTMA) precipitates out of the mixture and rinse thoroughly;

Place the DNA or RNA-surfactant (CTMA) precipitates in a beaker and then place in an oven at ~40° C. to dry the DNA-surfactant (CTMA) precipitates overnight, for example, approximately 8 hours;

Make organic solvent (such as, for example, butanol)-based DNA-surfactant (such as, CTMA) solution: Dissolve the DNA-surfactant precipitate in organic solvent at a ratio of about 10 weight percent of DNA or RNA-surfactant to organic solvent using a tumbler or a magnetic stirrer. At room temperature, for example, approximately 60-80 degrees F. mix until completely dissolved which is for approximately 6-8 hours. At 40 degrees C. the mixing time can be reduced to approximately 1 hour.

Making BESM Films

Make BESM by mixing metal nano-powders at a desired ratio (wt %, typically from 2-10 wt %) with the DNA or RNA-surfactant-solvent solution using a stirrer or sonicator;

Cast BESM on substrates, such as glass or plastic slides and dry them at room temperature to form BESM films on the substrates. BESM film thickness is typically around 30-50 μm.

A wide selection of metal nanoparticle and nanopowder fillers have been tested for their performance in EMI shielding efficiency, including, but not limited, silver, carbon-based graphite, graphene and other metal-based nanopowders and nanoparticles.

Figure 1B:
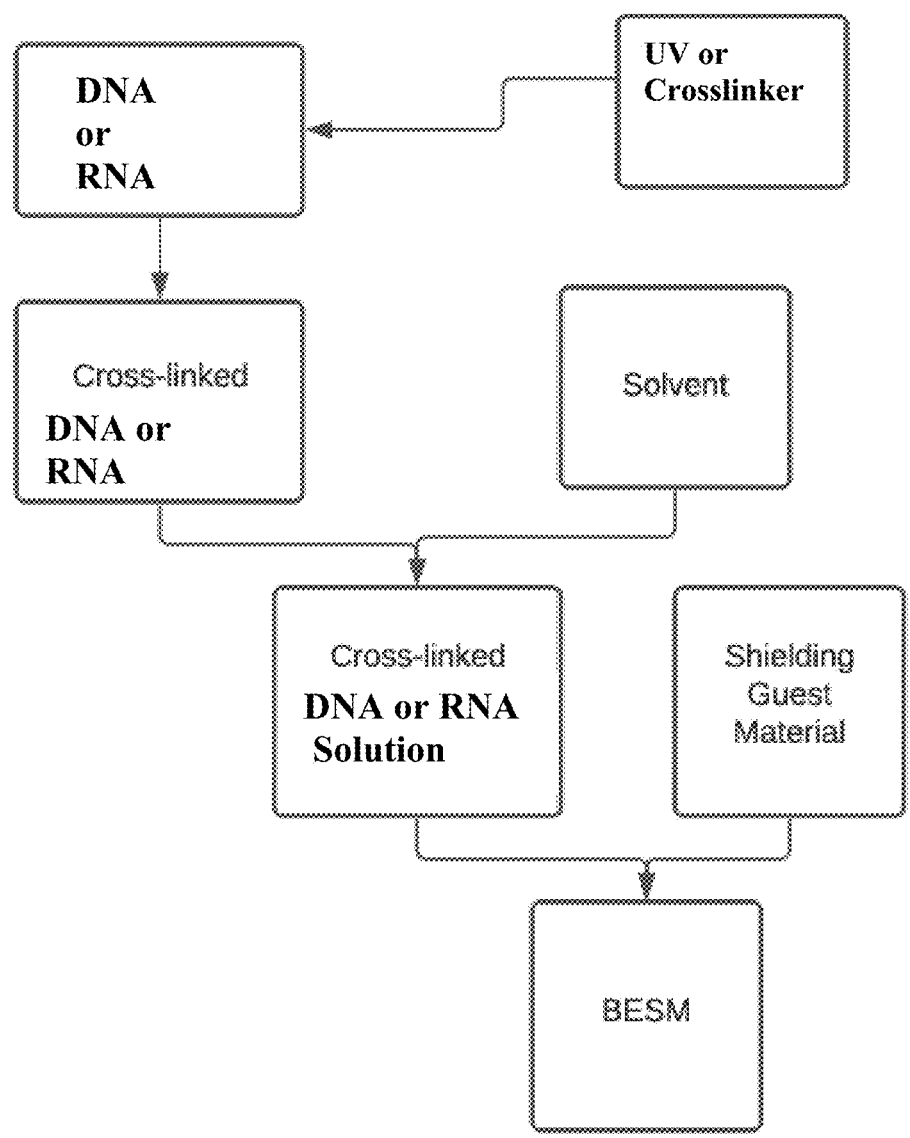
FIG. 1B is a schematic block diagram illustration of another embodiment of a fabrication procedure of the BESM (DNA or RNA-based in this embodiment)

In another embodiment, shown in FIG. 1B, DNA or RNA is used as the biopolymer. The DNA or RNA is cross-linked. In one embodiment, the DNA or RNA is exposed to ultraviolet (UV) light in order to cross-link the DNA or RNA. In one instance, a UV lamp (such as, for example, Miltec or Moritex UV lamps) is used for the cross-linking reaction of DNA or RNA molecules. In one instance, the UV lamp is powerful enough so that no UV curing agents are necessary to start the crosslinking reactions. UV irradiation causes cross-linking reactions among DNA or RNA molecules to insolubilize DNA or RNA molecules in water.

In another embodiment, the DNA or RNA is cross-linked using a cross-linker. In one instance, these teachings not being limited only to that instance, the cross-linker includes at least one of aldehydes, such as poly(phenyl isocyanate)-co-formaldehyde, cisplatin, cis-diamminedichloroplatinum (II), Chloro ethyl nitroso urea, earmustine, psoralens, or mitomycin C.

In. other instances, the DNA or RNA-surfactant based complex is cross-linked using molecules or compounds leading to oxidative stress. (See, for example, Damian G. Deavall, Elizabeth A. Martin, Judith M. Homer, and Ruth Roberts, Drug-Induced Oxidative Stress and Toxicity, Journal of Toxicology Volume 2012, Article ID 645460, which is incorporated by reference here in in its entirety and for all purposes.)

The cross-linked DNA or RNA is soluble in an organic solvent, forming a cross-linked DNA or RNA solution. The shielding guest material is added to the cross-linked DNA or RNA solution, resulting in the BESM.

Figure 1C:
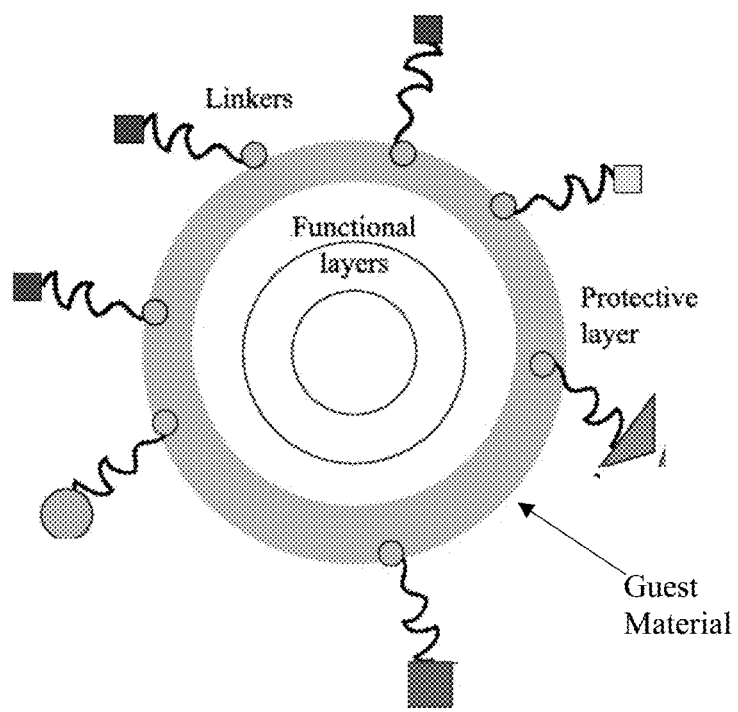
FIG. 1C is a graphical representation of a functionalized shielding guest material (FIG. 1C is a modified version of a figure By OV Salata; vectorised by NikNaks—Vectorised version of image from Journal of Nanobiotechnology http://www.jnanobiotechnology.com/content/2/1/3, CC BY-SA 3.0, https.//commons.wikimedia org/w/index php?curid=° ° 32977767)

While in the above discussion the shielding guest material can include at least one of metals, graphite, graphene, semiconductors, conductive polymers or other conductive materials, in other embodiments, the shielding guest material is functionalized. Functionalization is the attachment of organic molecules or polymers on the surface of the nanoparticle. In many embodiments, functionalization includes a covalent bond. In some embodiments, functionalization includes attachment of chemicals or biomolecules onto a surface of the shielding guest material. (See, for example, R. Subbiah, M. Veerapandian and K. S. Yun, Nanoparticles: Functionalization and Multifunctional Applications in Biomedical Sciences, *Current Medicinal Chemistry*, 2010, 17, 4559-4577, which is incorporated by reference here in in its entirety and for all purposes.) FIG. 1C is a graphical representation of a functionalized shielding guest material (FIG. 1C is a modified version of a figure By OV Salata; vectorised by NikNaks—Vectorised version of image from Journal of Nanobiotechnology http://www.jnanobiotechnology.com/content/2/1/3, CC BY-SA 3.0, https://commons.wikimedia.org/w/index.php?curid=:32977767) Attachments of ligands or molecular coatings to the surface of a nanoparticle facilitate nanoparticle-molecule interaction.

Functionalizing the guest shielding materials (such as, the metal, graphite, graphene, semiconductor and conductive polymer shielding guest materials) to interact with DNA or RNA will enhance shielding effectiveness by controlling the distribution of guest materials within the DNA or RNA or DNA or RNA-surfactant host. This can either be accomplished by electrostatic binding, and, when the biopolymer or polymer is DNA or RNA, by major or minor groove binding or intercalation.

Controlling the distribution of the guest shielding materials within the DNA or RNA will lead to uniform distribution of the shielding guest material within the DNA or RNA and hence lead to uniform electrical conductivity throughout the entire DNA or RNA-shielding guest, DNA or RNA-surfactant-shielding guest, material film.

Figure 1D:
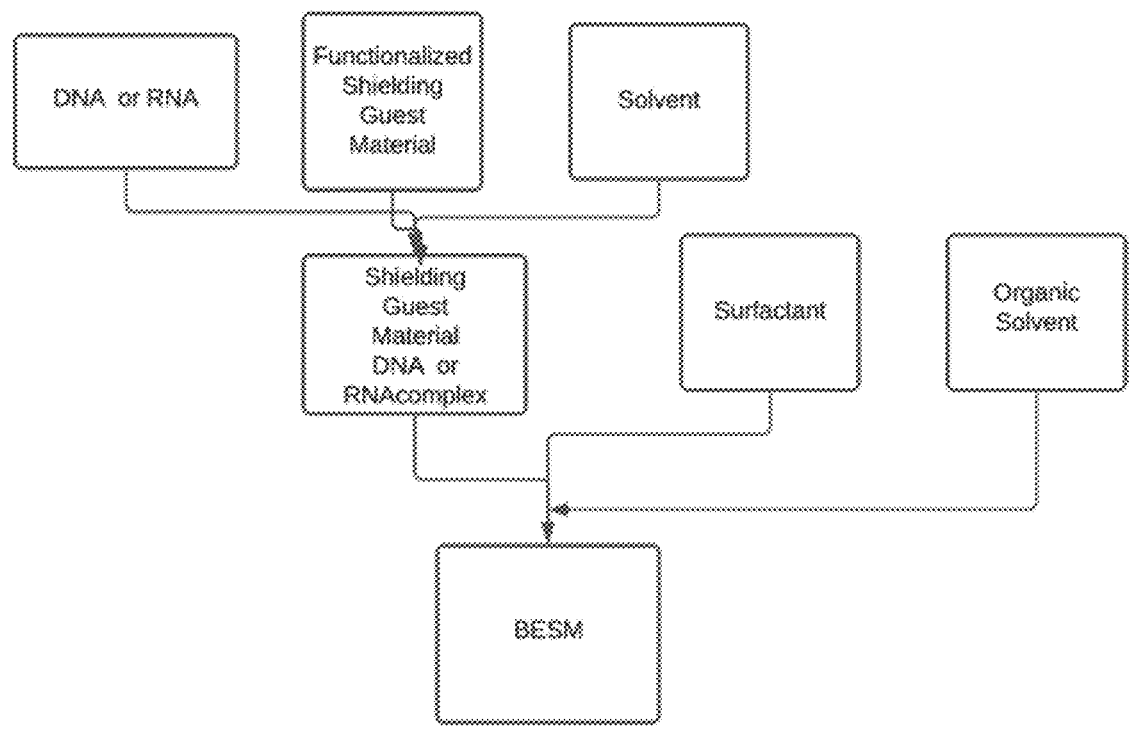
FIG. 1D is a schematic block diagram illustration of yet another embodiment of a fabrication procedure of the BESM (DNA or RNA-based in this embodiment)
Figure 1E:
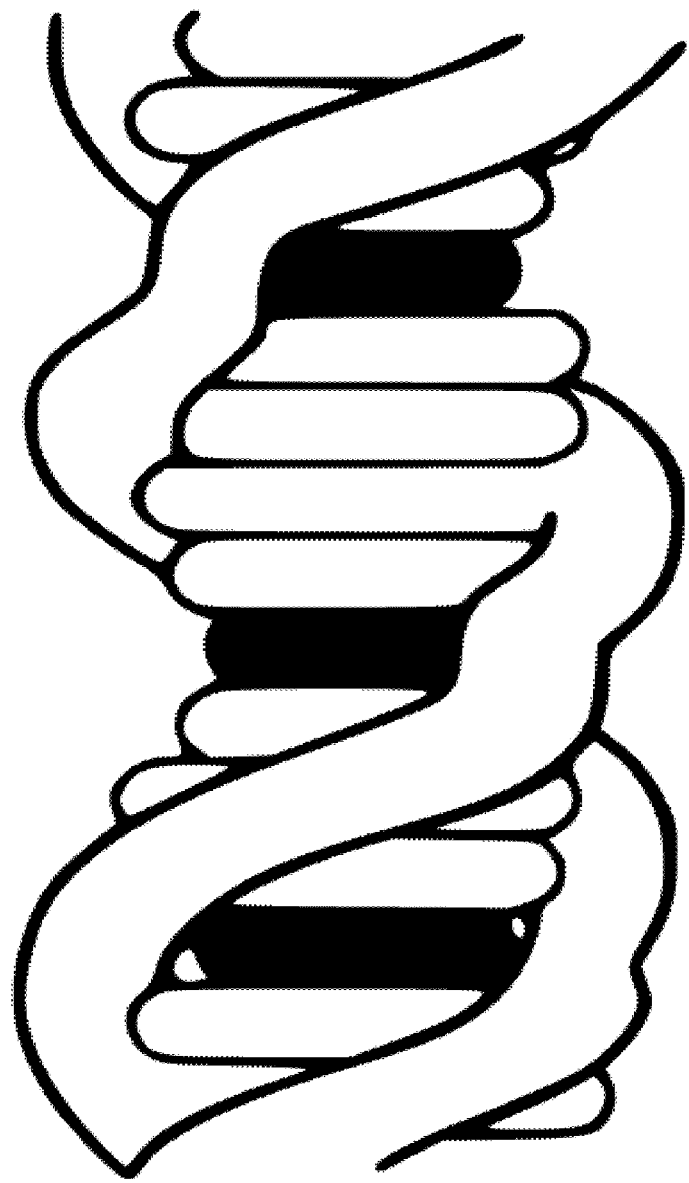
FIG. 1E is a graphical representation of DNA with intercalated components (black)
Figure 1F:
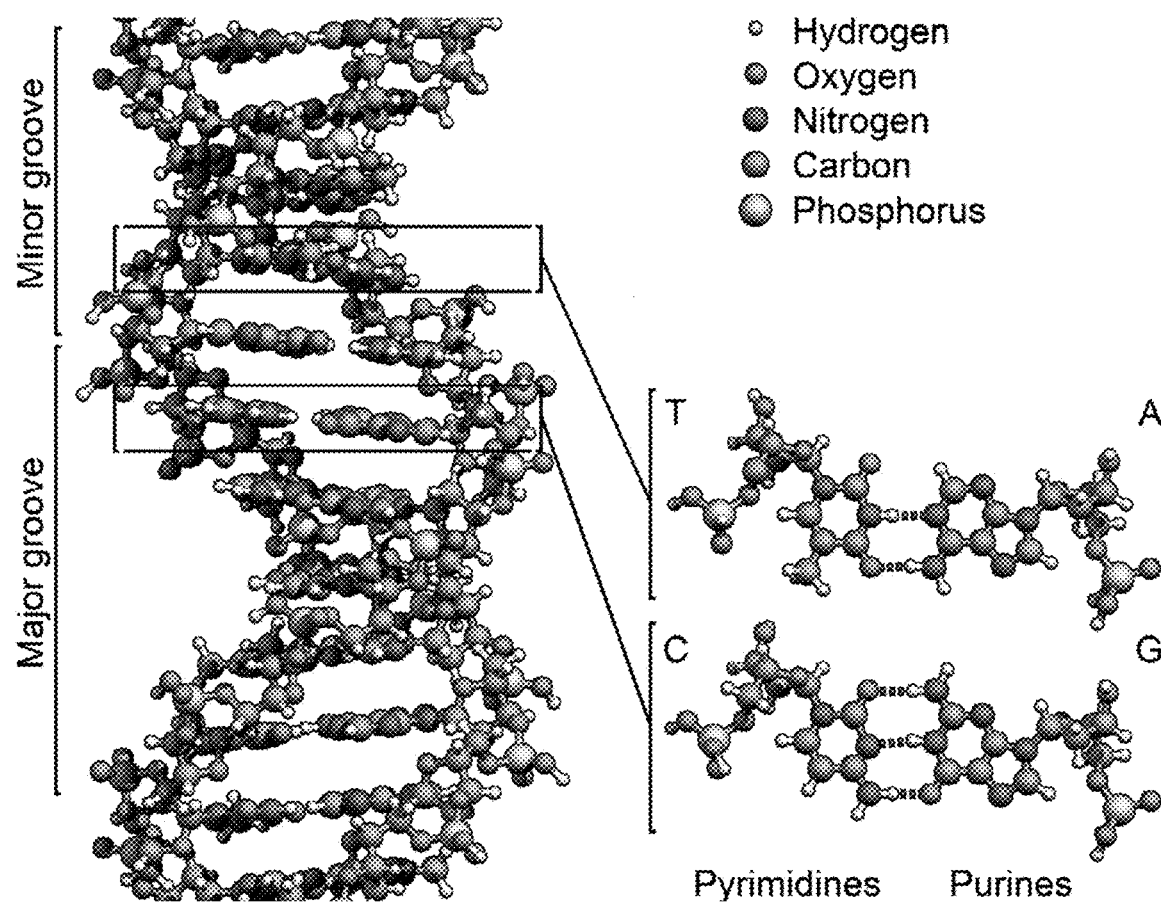
FIG. 1F is a graphical representation of a DNA strand depicting a major groove and a minor groove (FIG. 1F is a figure By Zephyris—Own work, CC BY-SA 3.0, https://commons.wikimedia.org/w/index.php?curid=15027555)
Figure 1G:
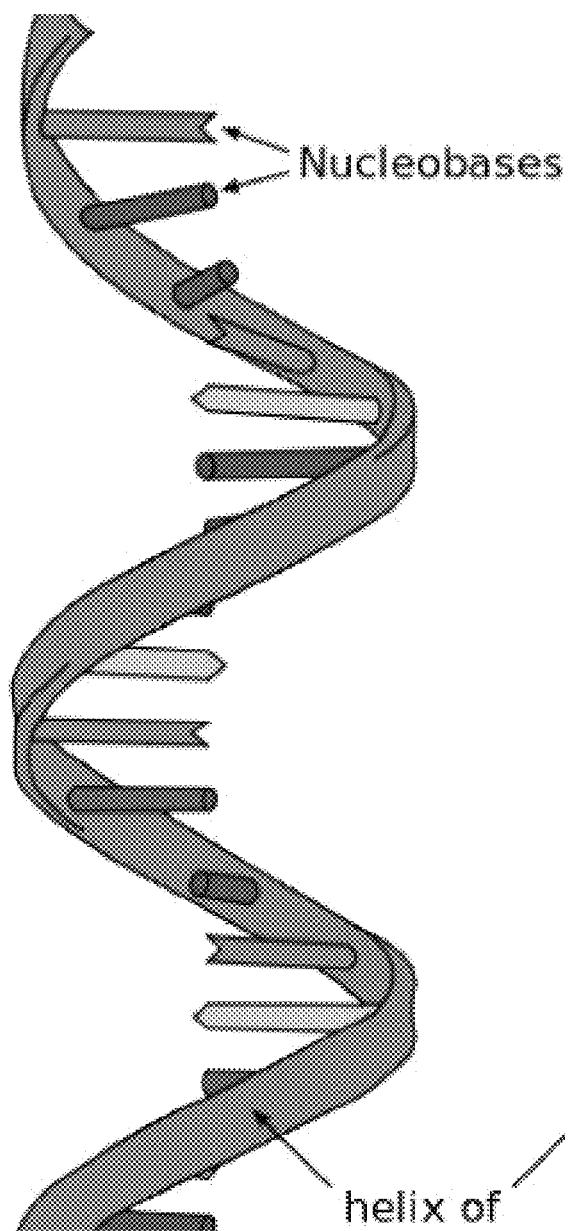
FIG. 1G a graphical representation of an RNA strand (CC BY-SA 3.0)

Since in many of the embodiments disclosed herein, the biopolymer or polymer is DNA or RNA, the DNA structure is shown in FIG. 1F and the RNA structure is shown in FIG. 1G. DNA is negatively charged due to the phosphate group that makes up every nucleotide. In RNA, the phosphate groups have a negative charge each, making RNA a charged molecule (polyanion). In one instance, the chemicals or biomolecules in the functionalized shielding guest material are proteins or peptides. In many instances, the biopolymer or polymer attaches on one side to the shielding guest material and on the other side to the DNA or RNA.

In one embodiment, the chemicals or biomolecules are selected such that the functionalized shielding guest material is positively charged. A positively charged guest shielding material will electrostatically attach to negatively charged DNA or RNA. The water soluble DNA or RNA-shielding guest can then be used as is. In one instance, the DNA or RNA shielding guest combination can be cross-linked, for example, by using UV exposure. In one embodiment, the cross-linked DNA or RNA-shielding guest material combination can be put into solution with an organic solvent, forming the BESM. In another embodiment, the DNA or RNA shielding guest combination is blended with the surfactant to render it water insoluble, placing solution with an organic solvent in order to form the BESM.

In embodiments in which the biopolymer or polymer is DNA or RNA and the chemicals or molecules in the functionalized shielding guest material are peptides or proteins, the peptides or proteins can groove bind (to the major grooves or to the minor grooves, depending on the peptide or protein) or can intercalate into the DNA (See, for example, Richards. A. D. et al. (2007). Synthetic Metallomolecules as Agents for the Control of DNA Structure. ChemInform, pp. 471-483; J. M. Jamison et al., RNA-intercalating agent interactions: in vitro antiviral activity studies, Antiviral Chemistry & Chemotherapy (1990) 1(6), 333-347; S. A. ISLAM AND S. NEIDLE, Nucleic Acid Binding Drugs. X.* A Theoretical Study of Proflavine Intercalation into RNA and DNA Fragments: Comparison with Crystallographic Results, *Acta Cryst.* (1984). B40, 424-429 which are incorporated by reference herein in their entirety and for all purposes), forming a functionalized shielding guest material-DNA or RNA complex.

Intercalation is the sandwiching of a molecule between two adjacent pairs of bases in the DNA double helix or RNA (see, for example, Richards. A. D. et al. (2007). Synthetic Metallomolecules as Agents for the Control of DNA Structure. ChemInform, pp. 475). Intercalation is shown in FIG. 1E. In one instance, intercalating ligands are characterized by the possession of an extended electron deficient planar aromatic ring system. In that instance, the intercalating molecules can interact with the phosphate backbone.

In another embodiment, the peptides or proteins bind to one of the major grooves of the DNA or RNA. There is more room for the peptides are proteins to access the sides of the DNA bases. Molecules interact with a binder in one of the grooves. The patterns of H-bonds donor and acceptors on the basis are more easily identifiable on the major grooves of the DNA.

In embodiments in which the peptide or protein is a small molecule and the biopolymer or polymer is DNA or RNA, the peptides or proteins can bind to the minor groove of the DNA or RNA. small molecules that bind to B-DNA grooves do so either in or via the minor groove of the double helix of the DNA. In the RNA helix, the major groove is narrow (and deep) and the minor groove is wide (and shallow) and more accessible for a sequence-specific binder (see, for example, MAGALI FRUGIER AND PAUL SCHIMMEL, Subtle atomic group discrimination in the RNA minor groove, *Proc. Natl. Acad. Sci. USA*, Vol. 94, pp. 11291-11294, October 1997, which is incorporated by reference herein in its entirety and for all purposes).

For the above embodiments in which a functionalized shielding guest material-DNA or RNA complex is formed, the forming of the BESM is shown in FIG. 1D. Since the DNA is water-soluble, combining the shielding guest material-DNA or RNA complex with the surfactant may involve obtaining a shielding guest material-DNA or RNA-surfactant precipitate as described hereinabove. The shielding guest material-DNA or RNA-surfactant precipitate is then dissolved in organic solvent to obtain the BESM.

Figure 1H:
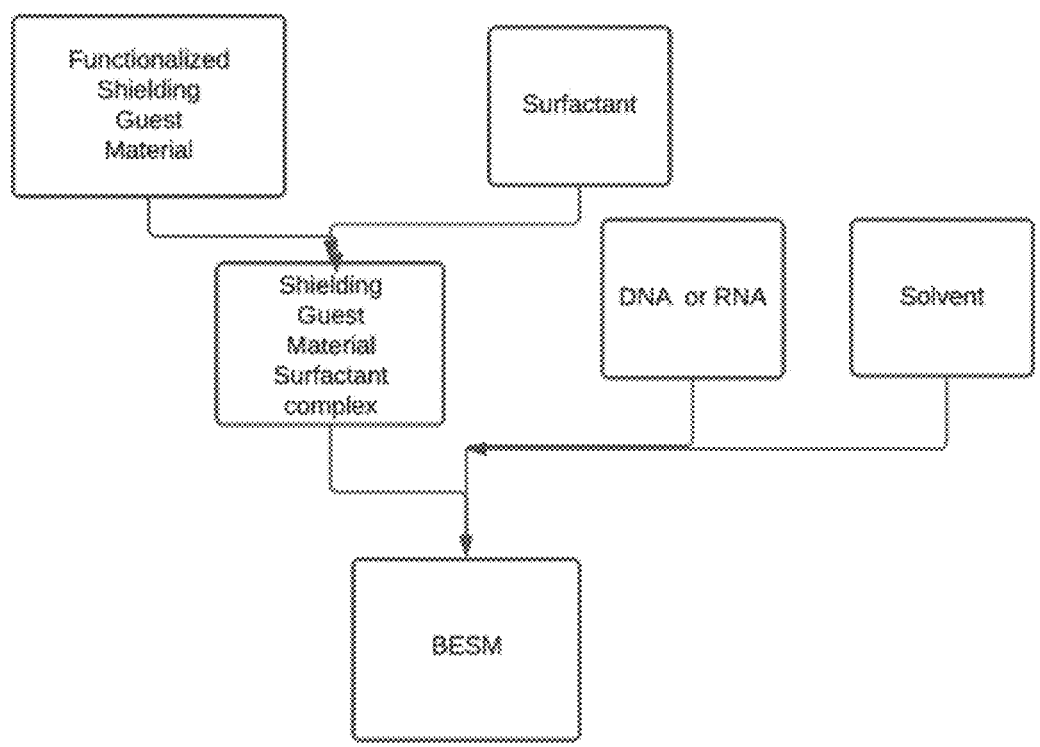
FIG. 1H is a schematic block diagram illustration of still another embodiment of a fabrication procedure of the BESM (DNA or RNA-based in this embodiment)
Figure 1I:
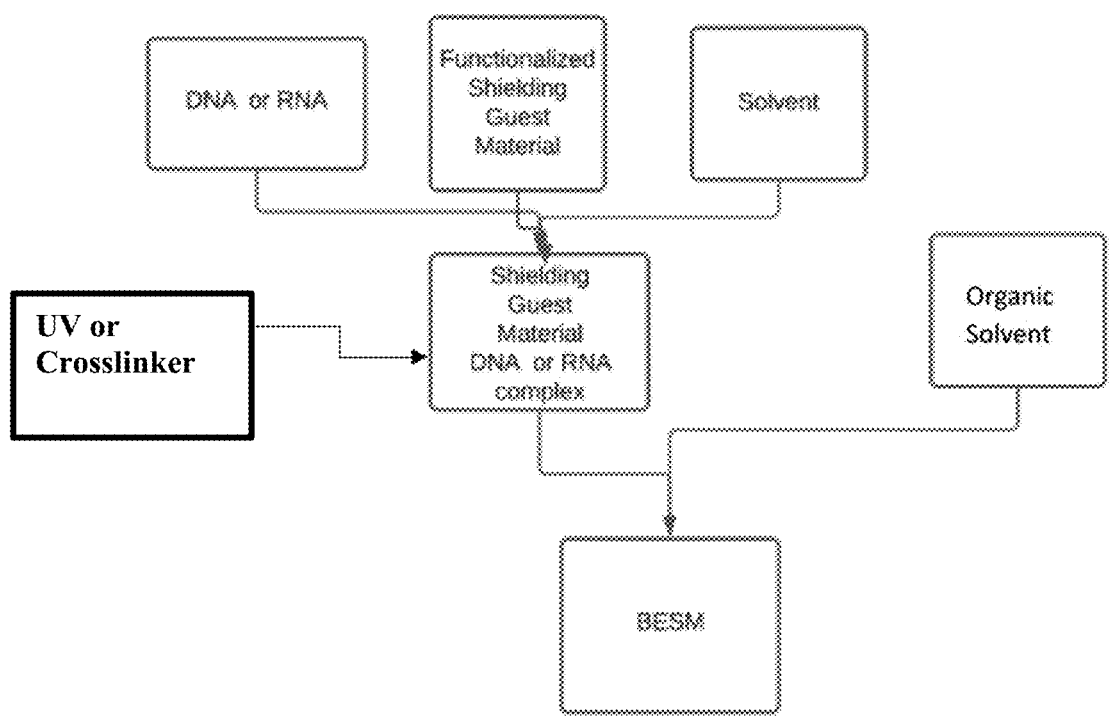
FIG. 1I is a schematic block diagram illustration of yet still another embodiment of a fabrication procedure of the BESM (DNA or RNA-based in this embodiment)

In the above embodiments in which a functionalized shielding guest material-DNA or RNA complex is formed, the functionalized shielding guest material-DNA or RNA complex can be rendered water insoluble by cross-linking, as shown in FIG. 1I. Cross-linking can be achieved by UV exposure. The cross-linked functionalized shielding guest material-DNA or RNA complex is dissolved in organic solvent to obtain the BESM. The same process can be used when the shielding guest material is not functionalized. A similar process applies when the shielding guest material is added after cross-linking the DNA or RNA. Another similar process applies when the UV is replaced by a cross-linker in the above processes. Embodiments in which the UV is replaced by radiation and a crosslinker molecule or compound leading to oxidative stress are also within the scope of these teachings.

In a further embodiment, the chemicals or biomolecules are selected such that the functionalized shielding guest material is negatively charged. The negatively charged shielding guest shielding material will electrostatically attach to positively charged surfactant, forming a shielding guest material-surfactant complex. The shielding guest material-surfactant complex is then blended with DNA, as shown in FIG. 1H. Since the surfactant is not water-soluble and the DNA is, blending the shielding guest material-surfactant complex with the DNA or RNA may require obtaining a shielding guest material surfactant complex-DNA or RNA precipitate from an aqueous solution and, afterwards, adding the organic solvent to the shielding guest material-surfactant-DNA or RNA precipitate.

The DNA that can be used in the above and related embodiments includes, but is not limited to, DNA derived from fish, plant, animal, plasmid DNA or synthetic DNA. The DNA can be purified, and the proteins reduced or removed by, but not limited to, enzyme processes. (For DNA purification, see, for example, DNA Purification|DNA Extraction Methods|Promega.) The DNA that can be used in the above and related embodiments includes high molecular weight DNA or low molecular weight NA.

In one instance, the EMI shielding material (BESM) of these teachings is disposed in a film by at least one of casting, spin depositing, spray coating, ink jet printing, vapor deposition, molecular vapor deposition or embossing, forming an EMI shielding material film. The EMI shielding material film can be electrically superconductive, conductive, semiconductive or insulating. In one instance, the EMI shielding material film is electrically superconductive, conductive, semiconductive or insulating on one surface of the film and a different one of electrically superconductive, conductive, semiconductive or insulating on another surface of the film. In one instance, thickness of the EMI shielding material film is between about 0.1 μm and about 90 mm.

The DNA-shielding guest, DNA-surfactant-shielding guest, material films can be coated with other shielding materials or films to enhance the EMI shielding or combine different types of shielding, depending on the application. The DNA-shielding guest, DNA-surfactant-shielding guest, material films can effectively block EMI radiation up to 85 dB, to date, over a frequency range of 8-12 GHz, to date, for 100 μm thick film thickness, to date.

The level of EMI shielding DNA-shielding guest, DNA-surfactant-shielding guest, material films, over any frequency range, can be increased or decreased, through selection of the guest material and type, or increasing or decreasing the film thickness.

The thickness of the DNA-shielding guest, DNA-surfactant-shielding guest, material films can range from submicron to 10's of mm depending on deposition technique, processing technique or application.

In one embodiment in which the biopolymer or polymer is a DNA or RNA-surfactant based complex, the DNA or RNA-surfactant based complex is cross-linked using a cross-linker. In one instance, these teachings not being limited only to that instance, the cross-linker includes at least one of aldehydes, such as poly(phenyl isocyanate)-co-formaldehyde, cisplatin, cis-diamminedichloroplatinum(II), Chloro ethyl nitroso urea, carmustine, psoralens, or mitomycin C. In. other instances, the DNA or RNA-surfactant based complex is cross-linked using molecules or compounds leading to oxidative stress. (See, for example, Damian G. Deavall, Elizabeth A. Martin, Judith M. Homer, and Ruth Roberts, Drug-Induced Oxidative Stress and Toxicity, Journal of Toxicology Volume 2012, Article ID 645460.)

Data is provided below for one embodiment in which a DNA-surfactant complex is used. For at least some of the data, the surfactant is hexadecyltrimethylammonium chloride (CTMA) It should be noted that these teachings are not limited to the data ranges provided in the embodiments in which a DNA-surfactant complex is used. Other embodiments within the scope of these teachings or other measurement technologies will provide different data.

Figure 2A:
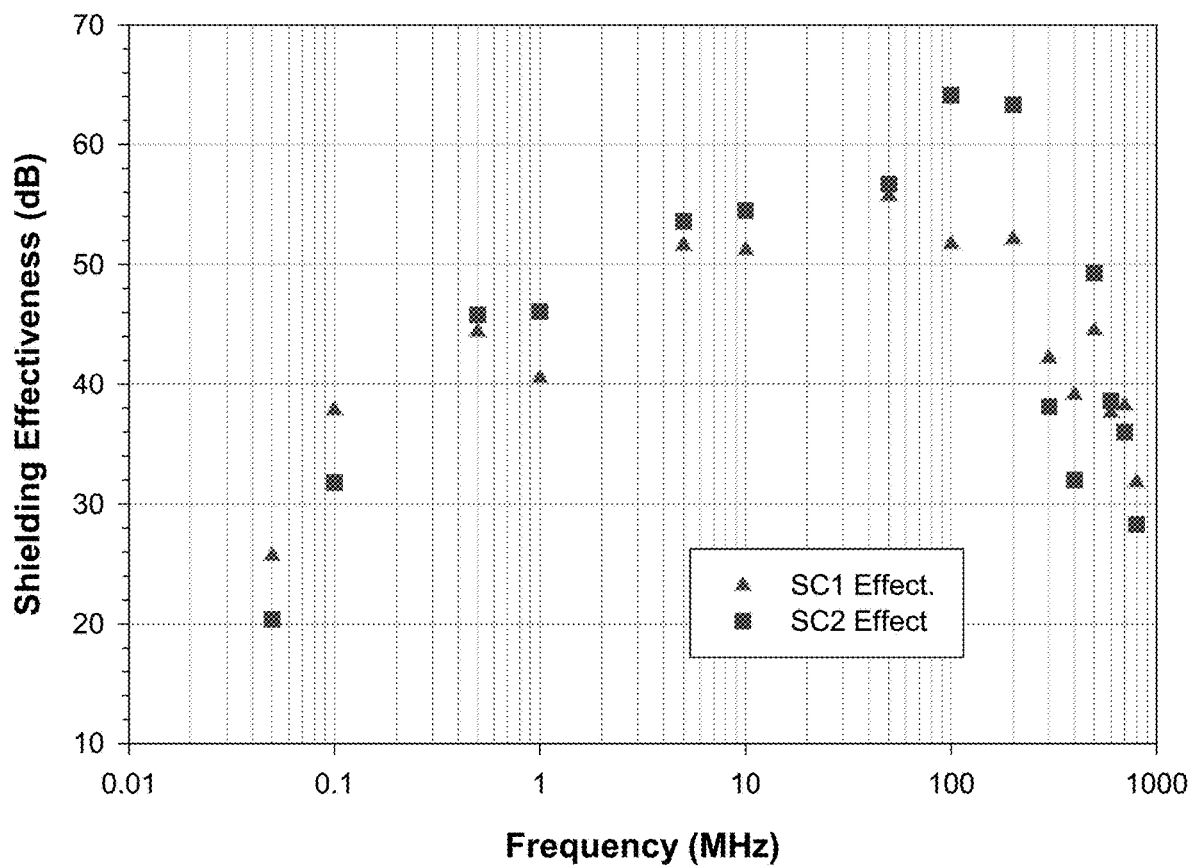
FIG. 2A is a set of typical measurement results of EMI shielding effectiveness of BESM at a frequency range from tens of KHz to hundreds of MHz.
Figure 2B:
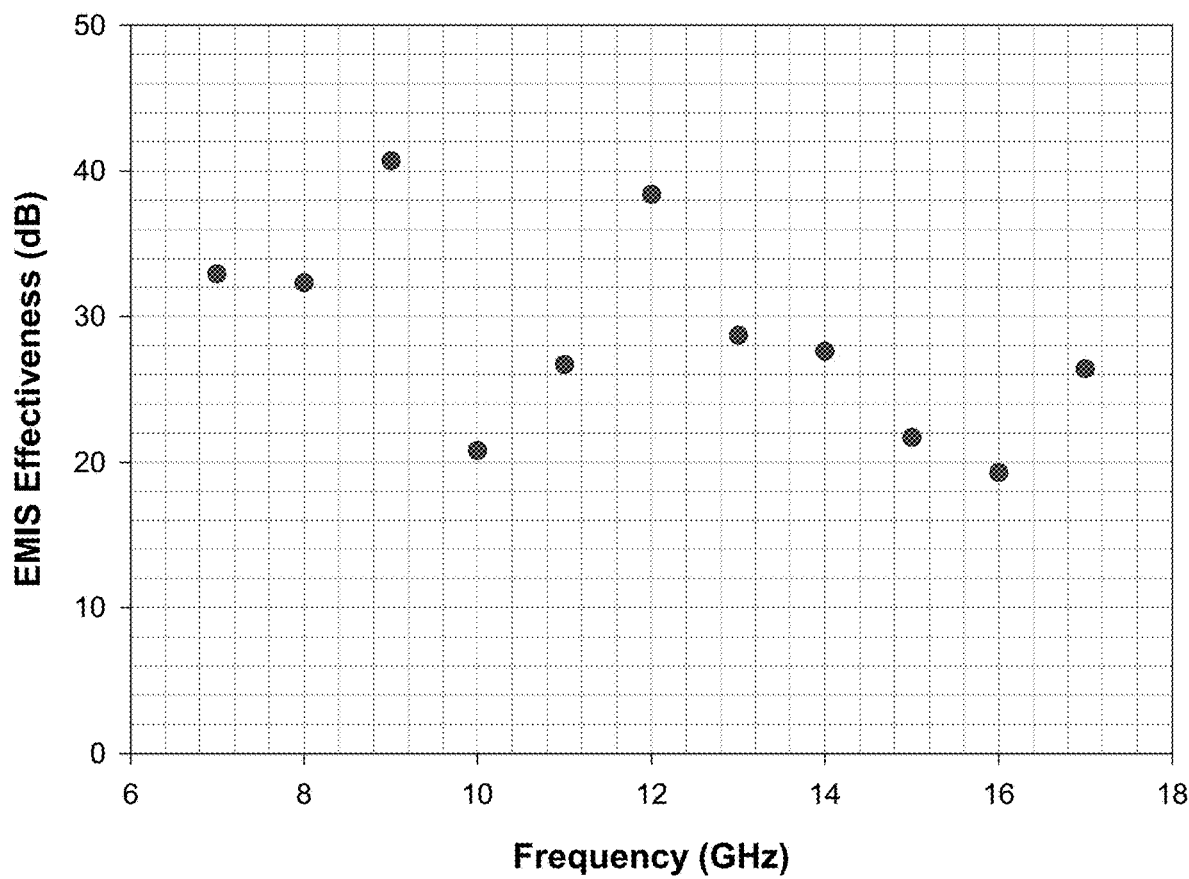
FIG. 2B is a set of typical measurement results of EMI shielding effectiveness of BESM at a frequency range from 6 GHz to 16 GHz.

BESM has been tested under a wide frequency range. FIGS. 2A and 2B show the BESM test results for a frequency range of from tens of KHz to hundreds of MHz. SC1 and SC2 were DNA-CTMA-silver nanopowder-based BESM samples on scotch tape with silver-doping ratios of 4% and 8% and thicknesses of 30-50 µm, respectively.

Figure 3:
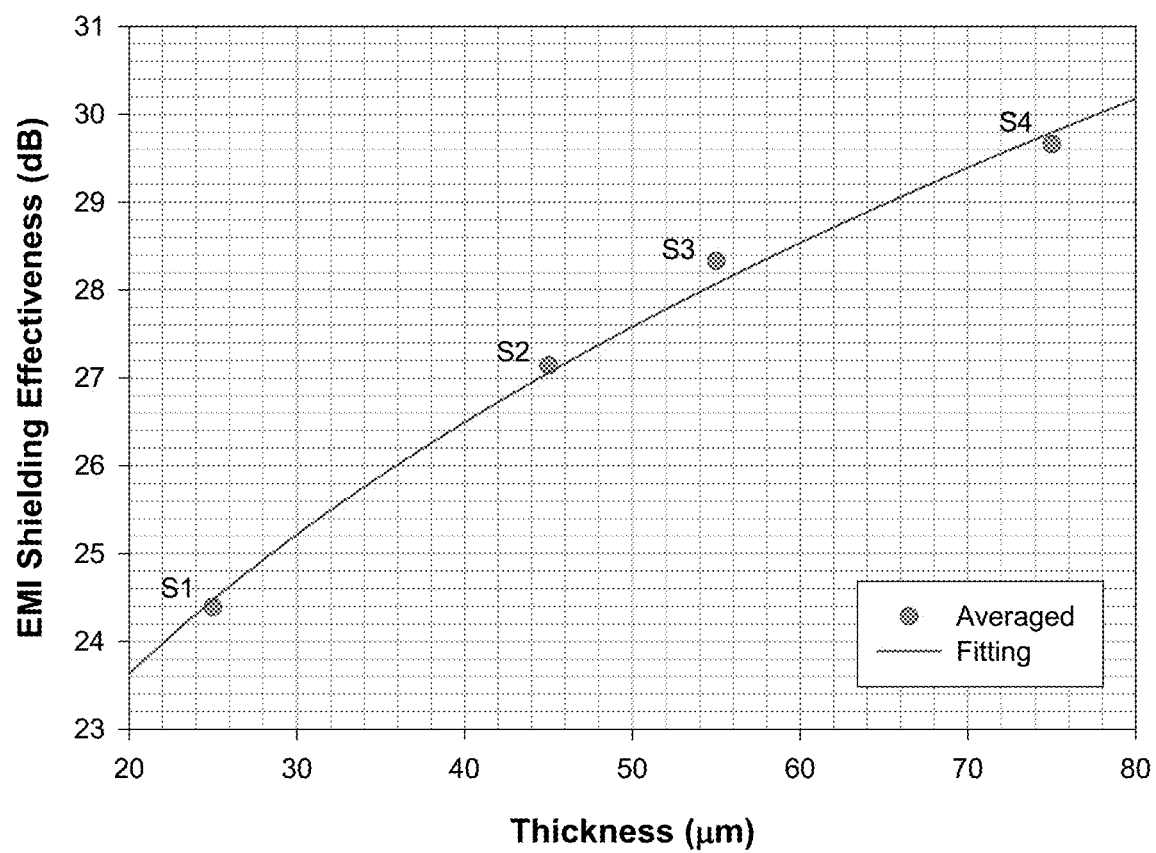
FIG. 3 is a set of typical measurement results of the EMI shielding effectiveness vs. film thickness in BESM samples.

BESM has been tested under wide frequency range. FIG. 3 shows the BESM EMI shielding effectiveness for a frequency range of from 7 GHz to 17 GHz. The samples were DNA-CTMA-silver and silver-aluminum nanopowder-based BESM samples on 1 inch×3-inch glass slides with Ag and Ag—Al-doping ratios of 5% each and thickness of 30-50 µm.

BESM has been tested over a temperatures range of −50° C. to +70° C. and over a frequency range of from 7 GHz to 16 GHz for EMI shielding efficiency. The averaged results showed no significant changes.

Figure 4:
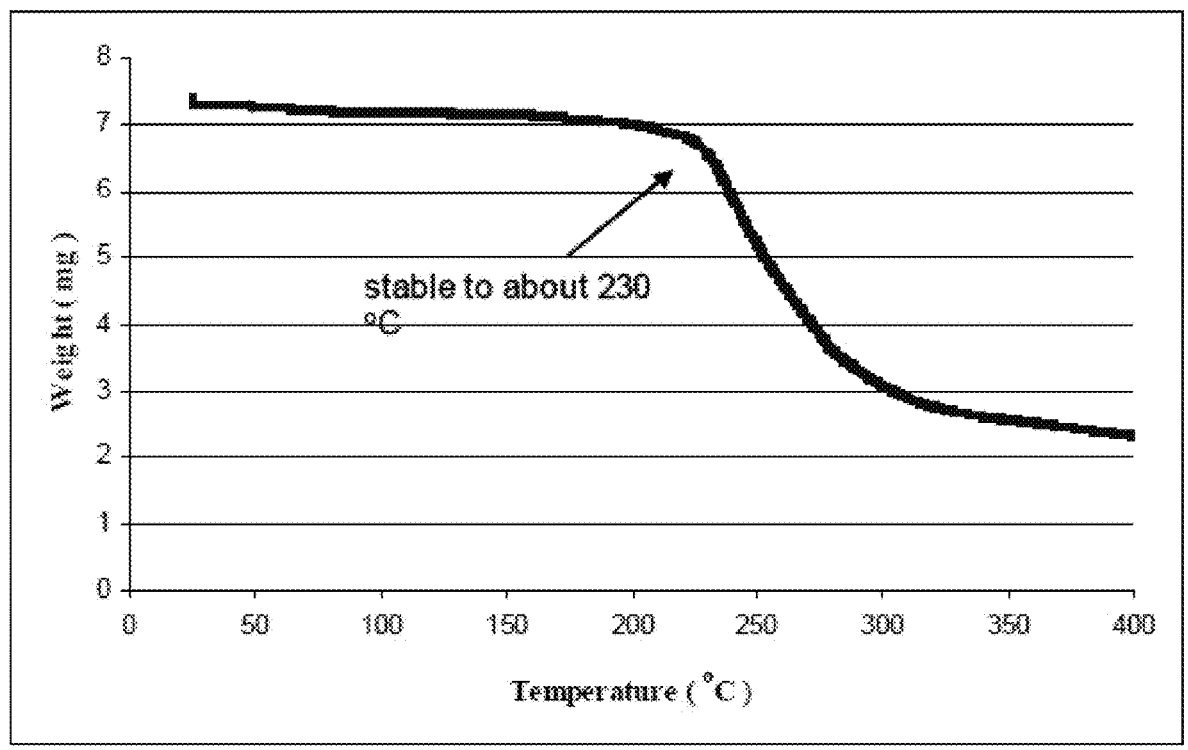
FIG. 4 is a DNA-CTMA-based film's thermal properties, indicating the film could sustain and be stable above 230° C.

DNA-CTMA possesses very stable thermal properties. FIG. 4 shows the film can sustain and be stable at temperatures as high as 230° C.

Non-biopolymer-based BESM materials, such as, but not limited, Poly (methyl methacrylate) (PMMA) and silver nanopowder were also formulated and could be used as a polymer matrix to replace lipid-DNA-CTMA.

In summary, novel biopolymer-metal and carbon nanoparticle/nanopowder-based EMI shielding materials (BESMs) have proven very effective nonconductive materials for broadband and high EMI shielding efficiency. The DNA-lipid-based complex (DNA-CTMA) served as the polymer matrix host, while the metal and carbon-based nanoparticles and nanopowders served as the fillers or guests. BESM could be made highly conductive or nonconductive (>30 MW/sq), depending on the nanoparticle and nanopowder doping ratios, whether one reaches the percolation threshold or not. It was found that at certain doping ratios, between about 4% and about 8%, which are also lower than the percolation threshold, the BESM films still possess very high EMI shielding efficiency while at the same time being nonconductive. Doping ratios for nanopowders are 4% to 8% to ensure material is nonconductive.

Figure 5:
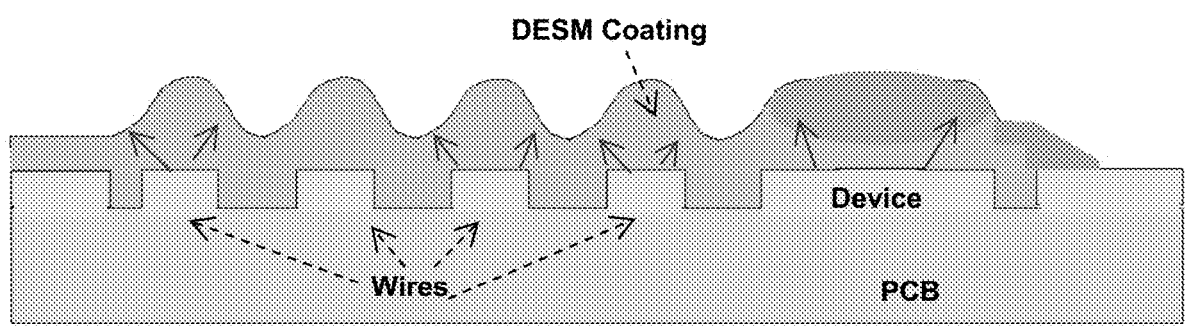
FIG. 5 is a schematic of a single layer EMI shielding coating on a microelectronic printing circuit board (PCB)

Embodiments of this invention including, but not limited to, the embodiments described above may be utilized as a single layer EMI shielding coating on microelectronics circuitry for intra- and inter-EMI shielding, as shown, for example, in FIG. 5. The DNA or RNA-shielding guest, DNA or RNA-surfactant-shielding guest material films can also provide EMI shielding between electronic circuit boards, devices or systems. The EMI shielding material film of these teachings is obtained by forming the EMI shielding material (BESM) of these teachings into a film by one of at least one of casting, spin depositing, spray coating, ink jet printing, vapor deposition, molecular vapor deposition or embossing.

Figure 6:
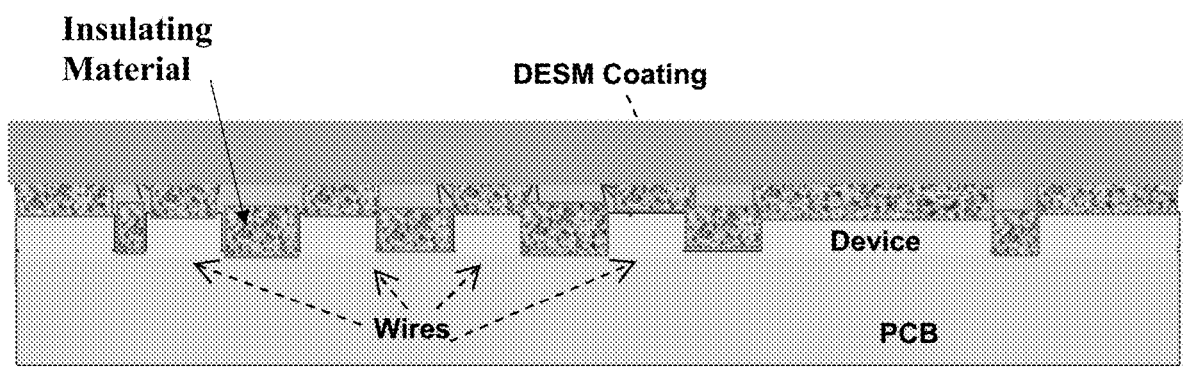
FIG. 6 is a schematic diagram of EMI shielding coating between wires and devices on a microelectronic printing circuit board (PCB).

In another embodiment, before producing the EMI shielding material film, a layer of insulating material is deposited, thereafter producing the EMI shielding material film on the layer of insulating material, as shown in FIG. 6. This embodiment enables providing EMI shielding between chips and wires on the circuit board itself. In some instances, the layer of insulating material is patterned and the layer of EMI shielding material film is disposed on areas of the pattern. The areas can be selected to provide EMI shielding between chips and wires on the circuit board itself. Providing EMI shielding between chips and wires on the circuit board itself be accomplished by depositing a thin layer, 5 nm to 10 nm of an insulating material including, but not limited to, nucleobases or organic polymers, on top of the circuit board and then depositing the DNA or RNA-shielding guest, DNA or RNA-surfactant-shielding guest, material directly on top of the thin insulating layer.

In yet another embodiment, providing EMI shielding between chips and wires on the circuit board itself is accomplished by controlling the electrical conductivity of the DNA-shielding guest, DNA-surfactant-shielding guest, material film through interaction of the shielding guest material with the DNA, discussed previously, through electrostatic binding, groove binding or intercalation and then depositing the DNA-shielding guest, DNA-surfactant-shielding guest, material directly on top of the circuit board.

Composite materials, such as polymer-matrices containing conductive fillers, are very attractive for shielding electromagnetic interference (EMI) due to their high shielding efficiency and seamlessness, processability, flexibility, lightweight and low-cost. Here, we report the development of novel, biopolymer-based EMI-shielding materials (BESMs), made up of DNA or RNA and shielding guest material, such as, but not limited to, metal and carbon nanoparticles and nanopowders. A thin DNA or RNA-based BESM layer (typically ~30-50 µm) can effectively block EMI radiation up to 60 dB over an RF frequency range of from KHz to tens of GHz, exhibiting excellent EMI shielding efficiency. A wide selection of metal and carbon nanoparticle/nanopowder fillers for BESMs has been tested for their performance in EMI shielding efficiency. Among them, silver and carbon-based nanoparticles/nanopowders have demonstrated the best performance and were selected for further investigation. The silver-doped DNA-based BESM films could also be made non-conductive while their EMI shielding efficiency was still well-preserved. The nonconductive BESM could have a great potential in the microelectronics industries for EMI shielding on electronic devices and circuit boards.

The present embodiments incorporate DNA or RNA-based biopolymer EMI-shielding materials (BESMs), made up of DNA or RNA and shielding guest materials, such as, but not limited to, metal nanoparticles and nanopowders. Doped with adequate metal and carbon-based nanoparticles and nanopowders as fillers, the BESMs have exhibited excellent EMI shielding efficiency. It has been shown that a thin BESM layer (typically ~50-100 µm) can block RF radiation up to 60 dB at frequencies ranging from KHz to tens of GHz. A wide selection of metal and carbon-based nanoparticles and nanopowders have been tested for their performance in EMI shielding efficiency. For example, but not limited thereto, silver and carbon have demonstrated excellent performance. Depending on the doping ratios, whether above or below the percolation threshold, the BESMs could be rendered very conductive or nonconductive. Even the nonconductive silver-doped DNA-based BESM films have shown very high EMI shielding efficiency. The nonconductive BESMs may have a great potential in the microelectronics industries for EMI shielding on electronic devices and circuit boards.

EMI shielding refers to absorbing or re-directing (reflecting or scattering) the propagation of electromagnetic radiation by a material as a shield. The BESM films can be reflection type, multiple reflection type, absorption type EMI shielding, or a combination of types.

a) Shielding by Reflection

For reflection of the radiation by a shield material, the material must be electrically conductive, i.e. it must have mobile charge carriers, (electrons or holes) which interact with the electromagnetic fields in the radiation. Metals are the most common materials for reflection-type shielding. The electrical conductivity of a shielding material needs not necessarily high and a material with a volume resistivity in the order of 1 Ω-cm could be good enough for effective EMI shielding.

b) Shielding by Absorption

For significant absorption of the radiation by the shield, the shield should have electric and/or magnetic dipoles that interact with the electromagnetic fields in the radiation fields. The materials that have a high value for their dielectric constant could provide efficient electric dipoles. It should be noted that the reflection losses decrease with increasing frequency, whereas the absorption losses increase with increasing frequency. Hence, EMI-shielding based on absorption would be much more effective at higher RF frequencies.

c) Shielding by Multiple Reflections (Scattering)

The mechanism of EMI shielding by multiple reflections, or scattering, is quite different than the single reflection shielding using conductive materials. Multiple reflections usually refer to the reflections at various surfaces or interfaces throughout the shielding materials. This mechanism requires the presence of a large effective internal surface area or interface area in the shield. An example of a shield with a large internal surface area is a porous or foam material. Another example (we will use it in our approach) is a material containing fillers which provide large internal surface areas. The losses due to multiple reflections can be neglected when the distance between the reflecting surfaces or interfaces are much longer compared to the skin depth.

d) Skin Effect

Electromagnetic radiation at high frequencies penetrates only the near surface region of an electrical conductor. This is known as the skin effect. The electric field of a plane wave penetrating a conductor drops exponentially with increasing depth into the conductor. The depth at which the field drops to 1/e of the incident value is called the skin depth (S), which is given by $$\delta = \frac{1}{\sqrt{\pi f \mu \sigma}},$$

where f is frequency, µ is the magnetic permeability, which equals µ0µr (µ0=1.26×10$^{-6}$ H/m and µ$_r$ is the relative magnetic permeability of the material compared with that of copper, which is 1), and σ is the electrical conductivity in Ω$^{-1}$ m$^{-1}$. Therefore, the skin depth decreases with increasing frequency and with increasing conductivity or permeability.

e) Composite Materials for Shielding

The DNA or RNA-shielding guest, DNA or RNA-surfactant-shielding guest, material films can be coated with other shielding materials or films to enhance the EMI shielding or combine different types of shielding, depending on the application. The level of EMI shielding DNA or RNA-shielding guest, DNA or RNA-surfactant-shielding guest, material films, over any frequency range, can be increased or decreased, through selection of the guest material and type, or increasing or decreasing the film thickness.

Due to the skin effect, a composite material having conductive fillers with small unit size is very effective since the filler's surface areas are large. Therefore, the smaller unit size of the fillers in the composite material, the better the effectiveness of the EMI shielding.

The advantages of DNA or RNA-based shielding materials include:

a) Low Cost i. Low material cost. DNA is a byproduct of the fishing industry, such as salmon milt and row sacs; therefore, it could be very low cost.

ii. Low processing cost due the simple and low temperature processing procedures.

b) Properties for High EMI-Shielding Effectiveness i. Variety of electrical conductivity. Depending the properties and concentrations of doping fillers, the DNA or RNA-based composite materials could be very conductive or nonconductive. More interestingly, the nonconductive BESM could have very efficient EMI shielding. Such a unique property of BESMs could have many applications in the microelectronics industry.

ii. Large dielectric constant of DNA. The dielectric constant of DNA has been measured at 8 to 14 and could be made >400. A large dielectric constant in the materials provides large amount of electric dipoles that effectively absorb EM wave, enhancing effectively EMI-shielding.

c) Large Thermal Conductivity

Measuring the thermal conductivity of, for example, DNA of 0.82 W/(m, K) shows it to be approximately seven time higher than PMMA. A large thermal conductivity can dissipate heat quickly that is very important for EMI shielding on high-speed electronic devices, which usually create quite an amount of heat when they are operated.

The embodiment of BESM described herein for which data is provided is comprised of a DNA-cetyltrimethylammonium (CTMA) matrix material and metal and carbon nanoparticles/nanopowders (fillers). (It should be noted that the other embodiments are also within the scope of these teachings). The materials and fabrication procedures are described as follows.

DNA and DNA-CTMA: The raw DNA material (salmon sperm-based) was provided by Prof. N. Ogata, Chitose Institute of Science and Technology, Chitose, Japan. A DNA-lipid complex, namely DNA-CTMA was produced as the host matrix material in the experiments. DNA could be readily converted to the DNA-CTMA complex by a cationic surfactant reaction. The resulting DNA-CTMA complex is only soluble in polar organic solvents, but not soluble in water. The CTMA was purchased from Sigma-Aldrich.

Metal and Carbon fillers: A wide selection of metal and carbon nanoparticle/nanopowder fillers has been tested for their performance in EMI shielding efficiency.

Among them, silver and carbon-based nanoparticles and nanopowders have the best performance and were selected for further investigation. Some typical metal fillers used in our experience are listed in Table 1 below:

TABLE 1

Metal fillers used in BESM

| Metal Powder | Type | Size | Purity | Maker |
| --- | --- | --- | --- | --- |
| Ag | Metal-Basis | 0.7-1.3 μm | 99.9% | Alfa Aesar |
| Brass | Alloy | ~44 μm | 99.9% | Alfa Aesar |
| Cu | Metal-Basis | 0.5-1.5 μm | 99.0% | Alfa Aesar |
| Ag coated Al | Metal-Basis | ~50 μm | 99.0% | Alfa Aesar |
| Fe | Metal-Basis | ~44 μm | 98.0% | Alfa Aesar |
| Graphite #1 | Synthetic Conductive | ~44 μm | 99.9995% | Alfa Aesar |
| Graphite #2 | Natural Crystal | 2-15 μm | 99.9995% | Alfa Aesar |
| Ni | Metal-Basis | ~50 μm | 99.995% | Alfa Aesar |
| Graphene | Flakes | 8 nm | 99.9% | Graphene Lab |

Making DNA-CTMA solutions is described in greater detail above and summarized below i. Make water-based DNA solution: Dissolve DNA in de-ionized water at a proper ratio using a magnetic stirrer at room temperature for several hours until DNA is completely dissolved;

ii. Dissolve CTMA in deionized water using a magnetic stirrer for a few minutes until CTMA is completely dissolved;

iii. Make DNA-lipid complex, DNA-CTMA. Mix DNA and CTMA solutions with stirring for several hours. The white DNA-CTMA precipitates will visibly appear and will accumulate in the mixture;

iv. Filter the DNA-CTMA precipitates out of the mixture and rinse it completely;

v. Place the DNA-CTMA precipitates in a beaker and then place it in an oven at ~40° C. to dry the DNA-CTMA precipitates overnight;

vi. Make butanol-based DNA-CTMA solution: dissolve DNA-CTMA precipitate in butanol using a tumbler or a stirrer for several hours until it fully dissolved.

Making BESM films is described in greater detail above and summarized below:

i. Make BESM by mixing metal and carbon nanoparticles and nanopowders at the desired ratio (wt %) with the DNA-CTMA solution using a stirrer or sonicator;

ii. Cast BESM on substrates, such as glass or plastic slides and dry them at room temperature to form BESM films on the substrates. BESM film thickness is typically around 30-50 μm.

Experiments and Results

Results are provided herein below for the embodiment of these teachings comprised of a DNA-cetyltrimethylammonium (CTMA) matrix material and metal and carbon nanoparticles/nanopowders (fillers). (It should be noted that the other embodiments are also within the scope of these teachings.)

The DNA-based BESM samples were tested for their EMI shielding effectiveness under a very wide frequency range from KHz to tens of GHz. To cover such wide testing frequency range, the testing was divided into two frequency ranges, one of which was from sub-HF to UHF bands (tens of KHz to ~1 GHz) and the other was for X and Ku bands (6-18 GHz). Two different test setups were employed for these two frequency ranges, respectively. More detail with respect to the testing is set forth in the paper De Yu Zang, James Grote, "DNA-based nanoparticle composite materials for EMI shielding", in RF and Millimeter-Wave Photonics II, Robert L. Nelson; Dennis W. Prather; Chris Schuetz; Garrett J. Schneider, Editors, Proceedings of SPIE Vol. 8259 (SPIE, Bellingham, W A 2012), 825908 which is incorporated by reference herein in its entirety.

Test Setups

Test Setup for High Frequency (X and Ku Bands)

The setup was based on direct and open-air measurements that consisted of an RF-isolating chamber, two horn-antennas, RF generator and spectral analyzer. The RF-isolating chamber (~19"×26"×40" inner space) was constructed with RF absorber boards, which were thick (~2 inches) multiple-layered, conductive plastic sponges covered with aluminum foils. The boards could block or absorb up to 30 dB RF radiation. Thus, the RF-isolating chamber could significantly reduce the RF disturbance outside and inside the chamber during the measurements. A pair of WR 90 horn-antennas (Advanced Technological Materials Co.) were used as the RF emitter and receiver, respectively. The RF generator and spectral analyzer were HP 8341B RF generator (frequency range: 10 MHz-20 GHz) and HP 71200C RF spectral analyzer.

Two antennas were separated by ~15 cm, which was ~five times that of the RF wavelength (~3 cm at 10 GHz). Thus, the RF wave between the two antennas can be considered as a far field propagation. The BESM sample was located in the middle between the emitter and receiver.

Test Setup for Low Frequency (from Sub-HF to UHF Bands)

The test setup for low frequency testing was an indirect measurement using an electro-optic (EO)-based, electric (E)-field sensor. The setup consisted of an E-field sensor, an E-field generator, RF-generator and spectrum analyzer. In the experiments, the external E-field was controlled under MV/cm to keep the system in a linear regime, within which the system linearly responded to the RF power applied.

a) The EO E-Field Sensor

The EO E-field sensor is referred to as a slab coupled optical-fiber sensor (SCOS), constructed with an EO crystal and two specially treated optical fibers. The fibers were pigtailed with the tiny piece of EO crystal, Potassium Titanyl Phosphate (KTP), which is an E-field sensing area, as shown in FIG. 2(A). In the operation, the light beam was coupled into one optical fiber, passed through the EO crystal and then coupled out of another fiber. The light intensity would be altered by the presence of an external electric field in the EO crystal area via Pockels effect.

b) E-Field Generator and Test Scheme

A small and simple E-field generator formed by two parallel metal plates (~2.5"×2.5") was used in the experiments. In the operation, RF signals were applied to the E-field generator to create a strong E-field in the gap between the two parallel plates, where the EO E-field sensor was placed. As the RF was applied, the E-field generator create an E-field on the EO sensor and the light intensity in the EO sensor was altered by the E-field.

A pulse/function generator, HP 8111A, was employed to apply AC voltage to the E-field generator. The modulated light signals from the E-field sensor were detected by a photodetector (PD) and converted back to electrical signals, which were analyzed by an RF spectrum analyzer (HP 8656B). The system had linear response to the RF power if the e-field applied on the sensor was small enough (E<$10^6$ V/m). Therefore, the e-field was controlled to be not greater than $2 \times 10^6$ V/m for the experiments. Using this test setup, the EMI shielding effectiveness of BESM films could then be measured by comparing the strengths of the modulated light signals from the sensor with/without the BESM films in place.

BESM Samples

Most of the DNA-based BESM samples were made on glass slides (1"×3", typically) with a BESM film thickness of ~30-50 μm, except for a few which were made on Scotch tape. BESM glass samples were used for measurements in the high frequency ranges, while the BESM-Scotch tape samples were used in low-frequency ranges. The flexible BESM-Scotch tape samples could be easily wrapped on the E-field sensor As an example, but not limited thereto, twelve typical BESM samples on glass slides are listed in Table 2. They could be divided into two groups: a) single metal powders (S1-S4, S11 and S12) and b) multiple-metal powders (S5-S10). These samples were prepared for the measurements at high-frequencies (6-18 GHz).

Two BESM samples on Scotch tape were made with 4% and 8% Ag-doping ratios. Both samples were nonconductive and were prepared for the measurements at low frequencies ranging from tens KHz to ~1 GHz.

TABLE 2

BESM Samples used for testresults

| Samples | Dopers | DNA Concentration in butanol (wt %) | Doper Concentration in DNA-CTMA (wt %) | Surface Conductivity |
|---|---|---|---|---|
| S1 | Graphite #1[1] | ~10 | 10% | No |
| S2 | Graphite #2[2] | ~10 | 10% | Yes (at large areas) |
| S3 | Fe | ~10 | 20% | No |
| S4 | Ni | ~10 | 20% | No |
| S5 | Ag + Brass | ~10 | Ag: 5.3%, Brass: 7.8% | No |
| S6 | Ag + Cu | ~10 | Ag: 5%, Cu: 5% | No |
| S7 | Ag + Ag—Al[3] | ~10 | Ag: 5%, Ag—Al: 5% | Yes (at some small areas) |
| S8 | Ag + Fe | ~10 | Ag: 5.3%, Fe: 6.5% | No |
| S9 | Ag + Graphite #1[1] | ~10 | Ag: 5%, Graphite: 5.7% | No |
| S10 | Ag + Mumetal[4] | ~10 | Ag: 5%, Mumetal: 5% | Yes (at some small areas) |
| S11 | Mumetal[4] | ~10 | Mumetal: 10% | No |
| S12 | Ni | ~10 | Ni: 10% | No |

Test Results

Results from High Frequency Measurements

For example, but not limited thereto, twelve BESM samples listed in Table 2 above were tested for EMI shielding at frequencies of 6-18 GHz. These samples could be basically divided into two groups based on the types of the metal dopants: Group 1 (G1) with one single metal dopant; and Group 2 (G2) with multiple-metal dopants (silver plus other metals). In G1 group, single metal dopants included C #1 (synthetic conductive graphite), C #2 (natural microcrystal graphite), Ni, Fe, and Mumetal powders. In the G2 group, the dopants were: Ag—C #1, Ag-Brass, Ag—Fe, Ag—(Ag—Al), Ag—Ni and Ag-Mumetal. The shielding effectiveness of the G2 samples were generally better than that of most of the samples in the G1 group (except S1 and S2, which were compatible with that in G2 samples).

Figure 2C:
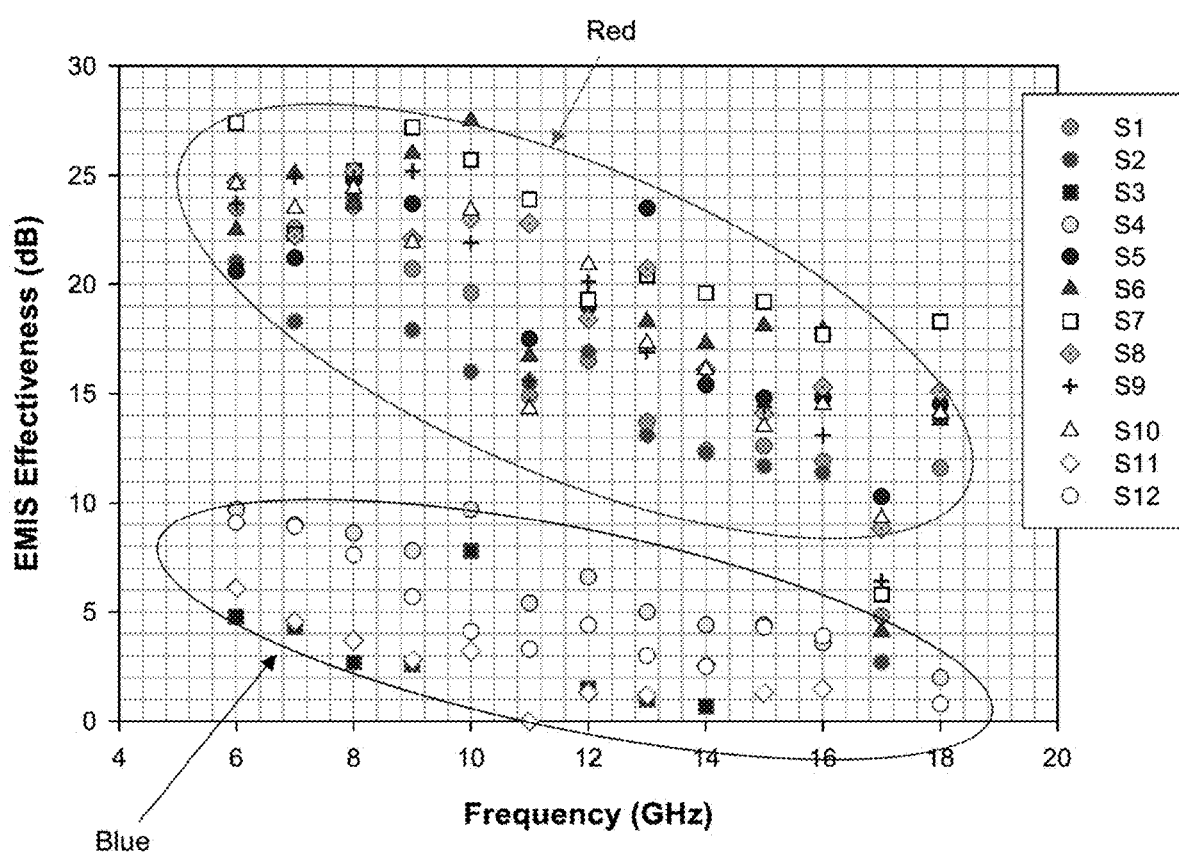
FIG. 2C is a set of typical measurement results of EMI shielding effectiveness of BESM for a frequency range from 6 to 18 GHz.

The test results are summarized in FIG. 2C, in which the EMI shielding effectiveness of BESM films was plotted as a function of RF frequencies. The data in this figure are divided into two groups. The data points in one group were obtained from the measurements of samples in G2 and S1 and S2 in G1, while data in the other group were obtained from the measurements of four samples in G1 (S3, S4, S11 and S12). The dopants of these eight samples in the red circle were silver-based multiple-metal and carbon-based graphite powders, C #1 and C #2, respectively. These samples demonstrated impressive EMI shielding effectiveness over a frequency range from 6 to 18 GHz. In contrast, the data points in the blue circle, obtained from measurements of S3, S4, S11 and S12 in G1 with dopants of Iron, Ni, and Mumetal, showed relatively poor EMI shielding effectiveness.

Results from Low Frequency Measurements

For low frequency measurements, an indirect measurement technique was used based on EO E-field sensor, as mentioned above. Two silver doped BESM samples on Scotch tape (SC1: Ag 4% and SC2: Ag 8%) were made for the measurements. Although the measurements were mostly limited by the system's signal-to-noise-ratio (SNR) in the frequency range below 200 MHz, their shielding effectiveness was still quite impressively high, and it could reach up to >60 dB at ~100 MHz. At frequencies above 200 MHz, the shielding effectiveness was somehow affected by the RF leakage from the system; however, the shielding effectiveness was still mostly above 30 dB. Compared with the test results of both samples, there was not any significant difference between them, indicating the doping concentration of 4% may be sufficient for EMI shielding purpose.

Metal fillers are responsible for the EMI shielding effects in either the conductive or nonconductive BESM and the conductivity of the fillers is utilized for high EMI shielding efficiency. Generally, the more conductive of the filler is, the better the EMI shielding effectiveness would be. However, some very high conductive metal powders, such as copper, did not exhibit EMI shielding efficiently when they were used as fillers in the BESM. The reason may be due to the fact that the copper nanopowders are easily subject to oxidation when exposed to air. Oxidized copper is not a good conductor, therefore, the copper doped BESM is generally not good for EMI shielding.

Shielding efficiency increased with increasing filler doping concentration (at small doping concentrations). However, it could very quickly reach the saturation point of doping concentration.

The biopolymer-based materials as defined in these embodiments have exhibited high EMI shielding effectiveness while being nonconductive. The nonconductive BESM may have a great potential in the microelectronics industries for EMI shielding applications on electronic devices and circuit boards.

Although the invention has been described with respect to various embodiments, it should be realized this invention is also capable of a wide variety of further and other embodiments within the spirit and scope of the appended claims.

What is claimed is:

1. An electromagnetic interference (EMI) shielding material comprising:
   a biopolymer or polymer, dissolved in organic solvents, and shielding guest materials; the shielding guest materials comprising at least one of particles, powders, tubes or rods, flakes, fiber or sheets; wherein the shielding guest material is functionalized by surface modification; surface modification comprising conjugation of chemicals or biomolecules onto a surface of the shielding guest material.

2. The EMI shielding material of claim 1 wherein the biopolymer or polymer comprises one of deoxyribonucleic acid (DNA) or ribonucleic acid (RNA).

3. The EMI shielding material of claim 2 wherein the chemicals or biomolecules intercalate with the DNA or RNA, forming a DNA or RNA-shielding guest combination.

4. The EMI shielding material of claim 3 wherein the chemicals or biomolecules comprise proteins or peptides.

5. The EMI shielding material of claim 3 wherein the DNA or RNA-shielding guest combination is blended with a surfactant, resulting in a DNA or RNA-shielding guest-surfactant based complex.

6. The EMI shielding material of claim 5 wherein the surfactant comprises a cationic surfactant.

7. The EMI shielding material of claim 2 wherein a functionalized shielding guest material is positively charged; and wherein the functionalized shielding guest material electrostatically binds to the DNA or RNA, forming a DNA or RNA-shielding guest combination.

8. The EMI shielding material of claim 7 wherein the DNA or RNA-shielding guest combination is blended with a surfactant, resulting in a DNA or RNA-shielding guest-surfactant based complex.

9. The EMI shielding material of claim 8 wherein the surfactant comprises a cationic surfactant.

10. The EMI shielding material of claim 2 wherein a functionalized shielding guest material is negatively charged; and wherein the functionalized shielding guest material electrostatically binds to a cationic surfactant, resulting in a shielding guest-surfactant combination.

11. The EMI shielding material of claim 10 wherein the shielding guest-surfactant combination is blended with the DNA or RNA, resulting in a DNA or RNA-shielding guest-surfactant based complex.

12. The EMI shielding material of claim 2 wherein the chemicals or biomolecules are configured to bind to a major groove of the DNA or RNA, forming a DNA or RNA-shielding guest combination.

13. The EMI shielding material of claim 12 wherein the DNA or RNA-shielding guest combination is blended with a surfactant, resulting in a DNA or RNA-shielding guest-surfactant based complex.

14. The EMI shielding material of claim 12 wherein the DNA or RNA-shielding guest combination is crosslinked.

15. The EMI shielding material of claim 2 wherein the chemicals or biomolecules are configured to bind to a minor groove of the DNA or RNA, forming a DNA or RNA-shielding guest combination.

16. The EMI shielding material of claim 15 wherein the DNA or RNA-shielding guest combination is blended with a surfactant, resulting in a DNA or RNA-shielding guest-surfactant based complex.

17. The EMI shielding material of claim 15 wherein the DNA or RNA-shielding guest combination is crosslinked.

18. The EMI shielding material of claim 1 wherein the shielding guest materials comprises at least one of nano-particles, micro-particles, nano-powders, micro-powders, nano-flakes, micro-flakes, nano-strands, micro-strands, nano-rods, micro-rods, nano-sheets or micro-sheets.

19. The EMI shielding material of claim 18 wherein the shielding guest materials comprises at least one of metals, graphite, graphene, semiconductors or conductive polymers.

20. An electromagnetic interference (EMI) shielding material comprising:
   a biopolymer or polymer, dissolved in organic solvents, and shielding guest materials; the shielding guest materials comprising at least one of particles, powders, tubes or rods, flakes, fiber or sheets; wherein the biopolymer or polymer comprises at least one of deoxyribonucleic acid (DNA), crosslinked DNA, DNA-surfactant based complex, ribonucleic acid (RNA), crosslinked RNA, RNA-surfactant based complex or crosslinked RNA-surfactant based complex.

21. The EMI shielding material of claim 20 wherein the biopolymer or polymer comprises the DNA or RNA-surfactant complex, resulting in a DNA or RNA-surfactant-shielding guest combination; and wherein the DNA or RNA-surfactant-shielding guest combination is cross-linked.

22. The EMI shielding material of claim 21 wherein cross-linking performed using a cross-linking method, the cross-linking method comprising one of use of a cross-linker, use of compounds or conditions leading to oxidative stress, or strong ultraviolet (UV) light.

23. The EMI shielding material of claim 22 wherein the cross-linker is used; and wherein the cross-linker can comprise aldehydes, the aldehydes comprising poly(phenyl isocyanate)-co-formaldehyde or Malondialdehyde, cisplatin, cis-diamminedichloroplatinum(II), Chloro ethyl nitroso urea, carmustine, psoralens, or mitomycin C.

24. The EMI shielding material of claim 20 wherein the biopolymer or polymer comprises the DNA-surfactant based complex; and wherein the surfactant comprises at least one of hexadecyltrimethylammonium chloride (CTMA), also referred to as cetyltrimethylammonium chloride, hexadecyltrimethylammonium bromide (CTAB), also referred to as cetyltrimethylammonium bromide, cetylpyridinium chloride (CP) or benzyldimethyloctylammonium chloride (BDMA).

25. The EMI shielding material of claim 20 wherein the biopolymer or polymer comprises the DNA or RNA-surfactant based complex; and wherein the surfactant comprises a surfactant from heptadecanoic or margaric acid family of fatty acids, or their derivatives.

26. The EMI shielding material of claim 20 wherein the biopolymer or polymer comprises at least one of deoxyribonucleic acid (DNA), crosslinked DNA, DNA-surfactant based complex, crosslinked DNA-surfactant based complex, ribonucleic acid (RNA), crosslinked RNA, RNA-surfactant based, crosslinked RNA-surfactant based complex; and wherein the DNA or RNA comprises DNA or RNA derived from fish, plant, animal, plasmid or synthetic.

27. The EMI shielding material of claim 20 wherein the biopolymer or polymer comprises at least one of deoxyribonucleic acid (DNA), crosslinked DNA, DNA-surfactant based complex, crosslinked DNA-surfactant based complex, ribonucleic acid (RNA), crosslinked RNA, RNA-surfactant based, crosslinked RNA-surfactant based complex; and wherein the DNA or RNA comprises purified DNA or RNA.

28. The EMI shielding material of claim 20 wherein the biopolymer or polymer comprises at least one of deoxyribonucleic acid (DNA), crosslinked DNA, DNA-surfactant based complex, crosslinked DNA-surfactant based complex, ribonucleic acid (RNA), crosslinked RNA, RNA-surfactant based, crosslinked RNA-surfactant based complex; and wherein the DNA or RNA comprises one of high molecular weight DNA or RNA, or low molecular weight DNA or RNA.

29. The EMI shielding material of claim 20 wherein the shielding guest materials comprises at least one of nano-particles, micro-particles, nano-powders, micro-powders, nano-flakes, micro-flakes, nano-strands, micro-strands, nano-rods, micro-rods, nano-sheets or micro-sheets.

30. The EMI shielding material of claim 29 wherein the shielding guest materials comprises at least one of metals, graphite, graphene, semiconductors or conductive polymers.

\* \* \* \* \*